US010884475B1

(12) United States Patent
Wang et al.

(10) Patent No.: US 10,884,475 B1
(45) Date of Patent: Jan. 5, 2021

(54) METHOD FOR DETERMINING BATTERY AVAILABLE POWER FOR AN ELECTRONIC DEVICE

(71) Applicant: Amazon Technologies, Inc., Seattle, WA (US)

(72) Inventors: John Wang, Sunnyvale, CA (US); Matthew Wong, Seattle, WA (US); Marko Bundalo, San Jose, CA (US); Yuting Yeh, Sunnyvale, CA (US); Kamran Mohajer, Lake Sherwood, CA (US); Vidhyananth Ramasamy Venkatasamy, San Jose, CA (US); Girish Sidhmalswamy Ghongdemath, Santa Clara, CA (US); Shuoqin Wang, Oak Park, CA (US); Jason Allan Graetz, Calabasas, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 391 days.

(21) Appl. No.: 15/698,562

(22) Filed: Sep. 7, 2017

(51) Int. Cl.

| | |
|---|---|
| ***G06F 1/32*** | (2019.01) |
| ***G01R 31/36*** | (2020.01) |
| ***G06F 1/3212*** | (2019.01) |
| ***G06F 1/3287*** | (2019.01) |
| ***G01R 31/367*** | (2019.01) |

(Continued)

(52) U.S. Cl.
CPC ......... *G06F 1/3212* (2013.01); *G01R 31/367* (2019.01); *G01R 31/389* (2019.01); *G01R 31/3842* (2019.01); *G06F 1/3287* (2013.01)

(58) Field of Classification Search
CPC .. G01R 31/36; G01R 31/382; G01R 31/3842; G01R 31/389; G06F 1/3212
See application file for complete search history.

(56) References Cited

U.S. PATENT DOCUMENTS 5,385,126 A 1/1995 Matthews
5,532,935 A * 7/1996 Ninomiya ............. G06F 1/3203 307/31

(Continued)

OTHER PUBLICATIONS

Ace Jeangle, Chalkboard Electronics, How to Control LCD Blacklight Brightness (Feb. 19, 2012) https://www.chalk-elec.com/?p=1391 (2012).

*Primary Examiner* — Walter L Lindsay, Jr.
*Assistant Examiner* — Milton Gonzalez
(74) *Attorney, Agent, or Firm* — Quarles and Brady LLP

(57) ABSTRACT

A portable electronic device determines a battery available power for the device's battery and manages device power usage based upon the battery available power. The device includes a battery and a controller. The controller is configured to receive a first voltage value for the battery at a first time, a first current value for the battery, a second voltage value for the battery at a second time, and a second current value for the battery. It is determined that a time difference between the first time and the second time exceeds a predetermined time threshold. An estimated resistance of the battery is determined based at least on a first difference between the first current value and the second current value and a second difference between the first voltage value and the second voltage value. Real-time power usage of the device is controlled based on the estimated resistance of the battery.

20 Claims, 13 Drawing Sheets

(51) Int. Cl.
*G01R 31/389* (2019.01)
*G01R 31/3842* (2019.01)

(56) References Cited

U.S. PATENT DOCUMENTS

| | | | | |
|---|---|---|---|---|
| 6,861,842 | B2 * | 3/2005 | Baeuerlein | G01R 31/389 324/426 |
| 7,190,171 | B2 * | 3/2007 | Kawakami | H01M 10/46 324/430 |
| 7,250,741 | B2 * | 7/2007 | Koo | H02J 7/0047 320/132 |
| 2004/0104709 | A1 | 6/2004 | Yamaji et al. | |
| 2008/0168287 | A1 | 7/2008 | Berry et al. | |
| 2011/0087842 | A1 | 4/2011 | Lu et al. | |
| 2012/0030493 | A1 | 2/2012 | Cepulis et al. | |
| 2012/0210325 | A1 | 8/2012 | De Lind Van et al. | |
| 2015/0198996 | A1 * | 7/2015 | Kliegman | G06F 1/3212 713/324 |
| 2015/0261284 | A1 | 9/2015 | Lee et al. | |
| 2015/0301121 | A1 | 10/2015 | Park | |
| 2016/0066266 | A1 | 3/2016 | Law et al. | |

* cited by examiner

500

METHOD FOR DETERMINING BATTERY AVAILABLE POWER FOR AN ELECTRONIC DEVICE

BACKGROUND

Batteries are used in numerous types of portable electronic devices including, without limitation, electronic book ("eBook") readers, mobile phones, laptop computers, and augmented reality devices. The battery life of a device determines the effective run-time for that device, and this run-time may change depending on the amount of power being consumed by the device at a given time. Accordingly, enhancing user experience and satisfaction with battery life and device performance continues to be a priority.

Conventional portable devices display a battery state of charge indicator to the user that is representative of the remaining capacity of the battery. Such state of charge indicators may not provide information that would inform a user of the rate at which power is being consumed and may not provide any indication of the effective remaining time-of-use for the device.

Moreover, portable devices are often susceptible to brownouts. A brownout occurs when power is momentarily lost in a system, resulting in the unexpected shutdown of a device. Brownouts may occur as a result of the battery of a device entering a low voltage condition when the amount of power demanded for use by the device exceeds the maximum power available to be output by the battery. Thus, it may be desirable to anticipate and avoid brownout conditions in portable devices where possible.

Another potential negative impactor of portable device performance involves overheating. As a portable device consumes power, heat is generated at the battery and at circuit components within the device as a result of Joule heating. If the temperature of the device is not adequately controlled, device components may be undesirably damaged. Additionally, these conventional thermal management techniques often involve limiting the performance of various resources in the device. It therefore may be desirable to improve the efficiency of thermal management in order to reduce the length and severity of these resource performance limitations.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1:
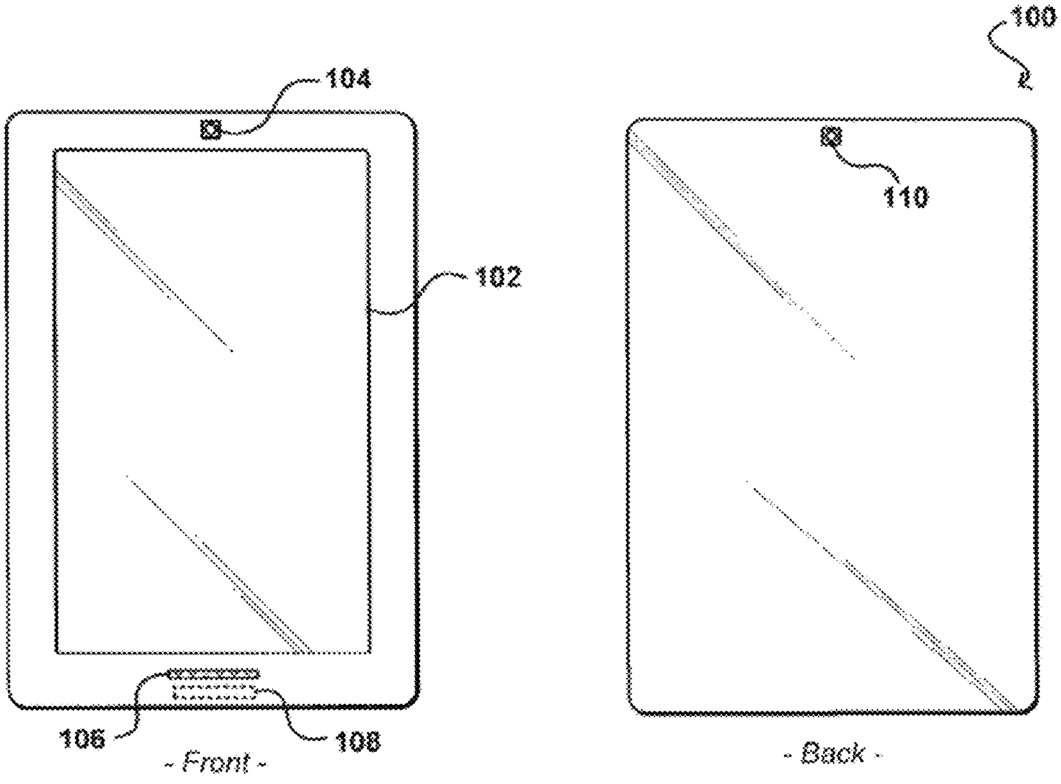
FIG. 1 illustrates front and back views of an example electronic device that can be used in accordance with various embodiments.

In various embodiments described herein, electronic devices include power and thermal management circuitry for monitoring and managing power usage and heat generation. In some examples, the electronic devices may include one or more components associated with power and thermal management, such as voltage sensor circuits that measure voltage across a battery, current sensor circuits that measure current output of a battery, and temperature sensor circuits disposed, for example, near heat generating components in the electronic devices, such as central processing units (CPUs), graphics processing units (GPUs), and batteries. The electronic devices may be portable consumer electronic devices such as tablets, eReaders, phones, watches, and the like.

Data collected by voltage, current, and temperature sensor circuits in an electronic device can be used to collect voltage, current, and temperature data for the electronic device. Methods can be implemented based on this data that allow for the estimation of resistance and maximum output power for a battery in the electronic device. For example, the maximum output power for the battery may be a limiting factor for how much power can be drawn from the battery at any particular time without causing the electronic device to shut down prematurely (i.e., to brownout).

Accurately estimating battery resistance can be important for enabling the accurate estimation of this maximum output power for the battery. In the present system, a controller or processor in a device continuously monitors voltage, temperature, and current sensor data for the device and performs one or more algorithms in which these data are continuously used to calculate one or more of a present estimated resistance for a battery, estimated maximum available power for the battery, instantaneous (real-time) power usage for the battery, average power usage for the battery, peak power usage for the battery, energy remaining for the battery, state of charge for the battery, and open circuit voltage for the battery. The results of these calculations can then be used as a basis for determining when and if power management functions and thermal management functions should be performed in the device. The algorithm used for estimating resistance of the battery is recursive in that past parameters used to perform old resistance estimates are fed back into the algorithm as inputs for estimating a new (i.e., present) resistance of the battery.

For example, a recursive updating algorithm (RUA) may be used to estimate battery resistance in a device. The RUA may, in some embodiments, utilize a Kalman filter to estimate the resistance of the battery. The Kalman filter, also known as a linear quadratic estimate, can be used to estimate the state of a system, in this case resistance of a battery, based on a series of measurements observed over time, and can be more accurate and less noisy than estimation based on a single measurement. If desired, however, other filtering methods such as least-square-methods-with-adaptive-weight (LSMAW) may be used in estimating resistance for the battery in order to similarly reduce noise in the battery resistance estimates.

When a device is first initialized and historical data is not available, a look up table (LUT) containing resistance values for various voltage and temperature values can be used as a basis for estimating an initial battery resistance value using voltage and temperature values acquired from the voltage and temperature sensor circuitry. For example, the LUT may be relied upon to estimate resistance when a device is detected to have transitioned from an off state to an on state or from a sleep state to an on state. These changes in states both represent forms of initialization for the device. The LUT may also be relied upon to estimate resistance during diagnostic testing of the device, which may require an initialization mode or diagnostic mode to be asserted for the device.

Once determined, maximum output power for the battery can be used as the basis for a variety of applications related to power and thermal management. For example, maximum output power for the battery may be used as a basis for determining device run-time estimates, for displaying a power status value to the user through a user interface of the electronic device, and for performing thermal throttling of thermal mechanisms in the electronic device to manage heat build-up within the device.

Power usage tends to be the limiting factor for the functionality offered by portable electronic devices that operate using a battery. For example, a portable electronic device may require the ability to browse the internet, to operate as a global positioning system (GPS) receiver, to render graphics using a graphical processing unit (GPU), and to communicate with external devices through a Wireless Area Network (WAN) or Personal Area Network (PAN), sometimes all simultaneously. A design tradeoff can exist between an amount of instantaneous power that can be utilized by a device (e.g., which, in-turn, limits the number of functions that can be performed by a device simultaneously), the size of the battery used to power the device, and the effective run-time of the device (e.g., the battery life of the device). The magnitude of this tradeoff is determined, at least in part, based on the efficiency of power management in the device.

Conventional portable electronic devices generally include only a conventional battery fuel gauge, which represents the state of charge (i.e., a percentage value representing an amount of charge remaining) of the battery, similar to a fuel gauge that indicates the amount of fuel left in the tank of a vehicle. However, such a battery fuel gauge does not indicate the maximum available power of the battery (e.g., how fast the remaining charge or "fuel" can be consumed without causing the battery voltage to drop precipitously). Changing power usage rate in a device generally cannot be indicated by such a conventional battery fuel gauge, so a user may not have an understanding of how quickly charge is being drained from the battery or how much time remains until the battery is drained completely at the current or anticipated power usage rate. Knowing the maximum available power of a device's battery may become increasingly important when the device is under strenuous usage conditions (e.g. high peak power demands). When power demand exceeds maximum available power, the battery is at risk of entering a low voltage condition, which can trigger a system shutdown, which can lead to shorter than expected device run-time or brownouts (e.g., when power is momentarily lost resulting in device shutdown).

Devices performing a variety of power intensive functions simultaneously will generally have a shorter device run-time compared to devices performing comparatively fewer or less power intensive functions. Shorter device run-times may negatively impact a user's experience when the user is attempting to perform a time-constrained task such as watching a movie or listening to a song, especially if the device run-time is shorter than the run-time needed to complete the task. However, power management operations performed in a device may include functionality for automatically adjusting power usage in the device in order to extend device run-time to align with the limits of a time-constrained task that is being performed by a user. In this way, the user may be able to successfully complete the time-constrained task within the time limits of the task, where the task would have otherwise been left incomplete at the time of battery-depletion-related device shutdown.

Thermal management is another important factor to consider in the operation of portable devices. As a portable device consumes power, heat is generated at the battery and at circuit components within the device as a result of Joule heating. If the temperature of the device is not adequately controlled, critical device components may be undesirably damaged. While conventional thermal management techniques are often used to mitigate excessive heat generation in portable devices, these techniques are mostly reactive in that they only begin managing heat in the device once the temperature has already reached a potentially damaging level.

Embodiments described herein use real-time device power usage values as a basis for thermal management and for performing resource performance limiting. This resource performance limiting is not necessarily restricted to CPUs and GPUs, but may extend to other heat generating circuit components that may be throttled to reduce temperature in the portable device. Additionally, by observing real-time power usage trends in the device, accurate predictions of excess temperature events may be made, which may be utilized to increase the rate of temperature monitoring during periods in which high temperature risk (e.g., high risk of the temperature crossing a predetermined thermal threshold or "trip") is predicted.

FIG. 1 illustrates front and back views, respectively, of an example electronic user device 100 that can be used in accordance with various embodiments. Although a portable computing device (e.g., an electronic book reader or tablet computer) is shown, it should be understood that any electronic device capable of receiving and processing input, or at least capable of communicating and/or being charged, can be used in accordance with various embodiments discussed herein, where the devices can include, for example, desktop computers, notebook computers, personal data assistants, smart phones, video gaming consoles, television set top boxes, and portable media players. In this example, the user device 100 has an electronic display screen 102 on the front side, which under normal operation will display information to a user facing the display screen (e.g., on the same side of the computing device as the display screen). The electronic display screen 102 may include a lighting component, such as a backlight or front light, that provides illumination for the electronic display screen 102. The lighting component may be powered using a pulse width modulation signal provided by a power supply, and the duty cycle of this pulse width modulation signal may determine the intensity of the illumination provided by the lighting component (e.g., corresponding to the brightness of the electronic display screen 102). By adjusting the duty cycle of the pulse width modulation signal, the intensity of the illumination can be adjusted which, in turn, controls how much power is consumed from the battery of device 100. The computing device in this example includes at least one front image capture element 104 and at least one back image capture element 110 positioned on the device such that, with sufficient lenses and/or optics, the user device 100 is able to capture image information in substantially any direction about the computing device. The example user device 100 also includes at least one microphone 106 or other audio capture device capable of capturing audio data, such as words spoken by a user of the device or sounds indicative of an environment in which the device can currently be found.

The example user device 100 also includes at least one position and/or orientation determining element 108. Such an element can include, for example, an accelerometer or gyroscope operable to detect an orientation and/or change in orientation of the user device 100. An orientation determining element also can include an electronic or digital compass, which can indicate a direction (e.g., north or south) in which the device is determined to be pointing (e.g., with respect to a primary axis or other such aspect). A location determining element also can include or comprise a global positioning system (GPS) or similar positioning element operable to determine relative coordinates for a position of the computing device. Various embodiments can include one or more such elements in any appropriate combination. As should be understood, the algorithms or mechanisms used for determining relative position and/or orientation can depend at least in part upon the selection of elements available to the device.

Figure 2:
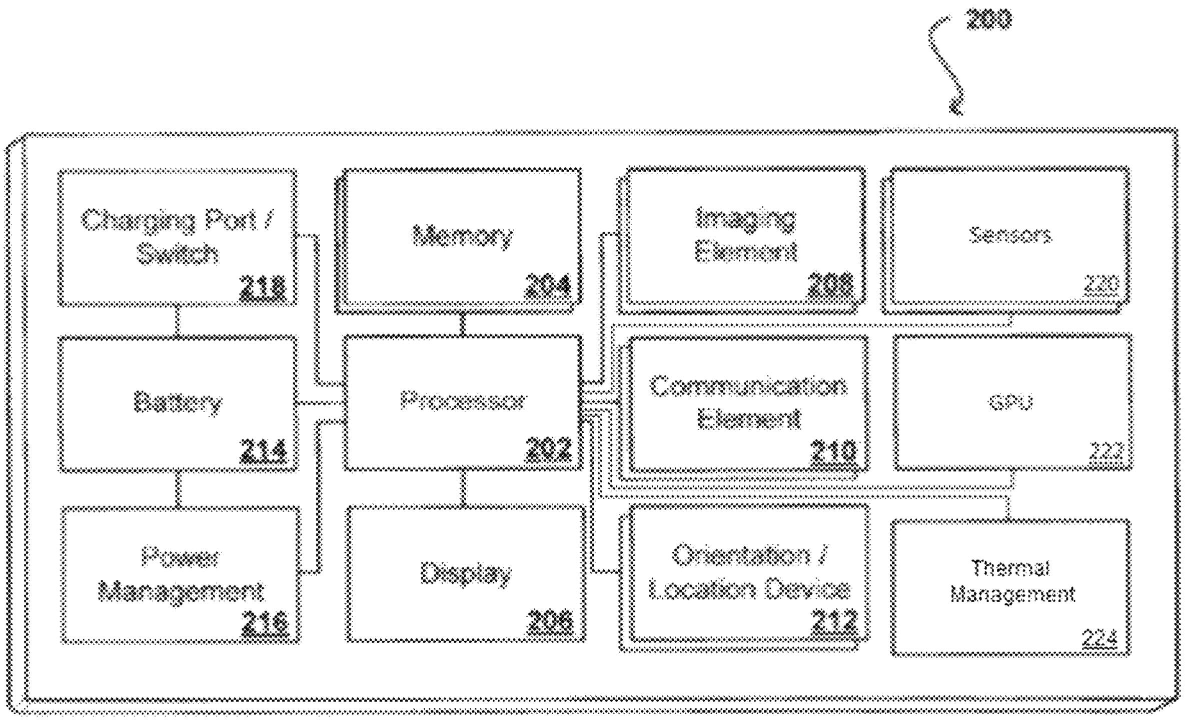
FIG. 2 illustrates example components of an example electronic device that can be used in accordance with various embodiments.

FIG. 2 illustrates a logical arrangement of a set of general components of an example computing device 200 such as the user device 100 described with respect to FIG. 1, which may be a portable electronic device. In this example, the device includes a processor 202 (e.g., which may be part of a controller) for executing instructions that can be stored in a memory device or element 204. As would be apparent to one of ordinary skill in the art, the device can include many types of non-transitory and/or transitory memory, data storage, or non-transitory computer-readable storage media, such as a first data storage for program instructions for execution by the processor 202 (e.g., by the controller), a separate storage for images or data, a removable memory for sharing information with other devices, etc. The device typically will include some type of display element 206, such as a touch screen, a liquid crystal display (LCD), or an electrowetting display, although devices such as portable media players might convey information via other means, such as through audio speakers. The display element 206 may include a lighting component that provides illumination for the display element 206. The lighting component may be powered using a pulse width modulation signal provided by a power supply, and the duty cycle of this pulse width modulation signal may determine the intensity of the illumination provided by the lighting component (e.g., corresponding to the brightness of the display element 206) and, thereby, the power consumption of the lighting component. As discussed, the device in many embodiments will include at least one image capture element 208 such as a camera or infrared sensor that is able to image a user, people, or objects in the vicinity of the device. It should be understood that image capture can be performed using a single image, multiple images, periodic imaging, continuous image capturing, image streaming, etc. Further, a device can include the ability to start and/or stop image capture, such as when receiving a command from a user, application, or other device. The device also can include one or more orientation and/or location determining elements 212, such as an accelerometer, gyroscope, electronic compass, or GPS device as discussed above. These elements can be in communication with the processor in order to provide the processor with positioning and/or orientation data.

In some embodiments, the computing device 200 of FIG. 2 can include one or more sideband or other such communication elements (not shown), such as a Wi-Fi, Bluetooth, RF, or another wireless communication system, enabling the user device to communicate with other devices or components, such as a charger or docking station. In some embodiments the device can include at least one additional input device able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device.

The example device 200 also includes a battery 214 or other appropriate power source. The power source can include, for example, at least one rechargeable battery, and can include other elements as well such as solar power cells or other such elements. The device also can include an intelligent charging port or switch 218, in at least some embodiments, which is controllable by the processor 202. The device might be plugged into an outlet or placed into a charging station, for example, but in at least some embodiments the charging switch 218 can control whether or not power is actually passed on to the battery for purposes of charging. For example, if the battery has almost no remaining charge then the switch might close in order to allow power to charge the battery, while in the case of a battery 214 that is nearly fully charged the charging switch 218 might open such that no charge passes to the battery at the current time. In some embodiments, the user can override such settings, whereby the device might always accept a charge or only accept a charge upon certain user settings, etc.

Example device 200 may also include at least one power management module or component 216, which can be implemented in software and/or hardware in communication with, or executed by, at least one processor 202 of the device 200. In at least some embodiments, the power management module 216 can monitor various aspects of the device, and its usage by a user, to determine when to adjust a functional state of at least one component of the device. For example, in response to detecting that real-time (e.g., instantaneous) power usage of device 200 exceeds a predetermined power usage threshold, power management module 216 may reduce the power usage of the device by throttling the performance of one or more power-intensive components of device 200 (e.g., by reducing an operating frequency of processors or by dimming display element 206 of device 200) or by disabling one or more functions of device 200 (e.g., by disabling WiFi, Bluetooth, or global positioning system (GPS) functions of device 200 and components associated with these functions). Herein, power usage of a device is defined as the current being drawn from a battery within the device times the voltage across the battery. Real-time power usage is the power usage at the time the current being drawn from a battery and the voltage across the battery are measured.

Similarly, device 200 may include thermal management module (or component) 224, which can be implemented in software and/or hardware in communication with, or executed by, processor 202 of device 200. In at least some embodiments, the thermal management module 224 can monitor and adjust various aspects of device 200 and its usage by a user to determine when to adjust a functional state of at least one component of the device. For example, in response to detecting that the temperature in a region of device 200 has exceeded a predetermined thermal trip threshold (e.g., a threshold trip temperature) for that region, the thermal management module 224 may reduce the power usage of the device by throttling the performance of one or more heat generating components of device 200 (e.g., by reducing an operating frequency of processors or by dimming the display element 206 of device 200) or by disabling one or more functions of device 200 (e.g., by disabling WiFi, Bluetooth, or global positioning system (GPS) functions of device 200 and components associated with these functions).

The example device 200 also includes a graphics processing unit (GPU) 222. GPUs are specialized processors configured to perform graphics-related operations, and may be used to accelerate rending of 2-dimensional or 3-dimensional graphics and/or to reduce the processing load placed on processor 202. GPUs may be more effective than general purpose processors for performing complex algorithms that may be required for various graphics intensive tasks, such as gaming, due to the highly parallel structure of GPUs. GPU 222 may be a significant source of heat while performing graphics-intensive processing tasks for device 200.

The example device 200 also includes sensors 220, which may include one or more temperature sensors, voltage sensors, and current sensors. Temperature sensors included in sensors 220 may be placed on or near sources of heat in the device, such as the central processing unit (CPU) (e.g., processor 202) of the device, GPU 222, the device display, and battery 214. These temperature sensors each sense temperatures in their respective regions and generate temperature data based on the sensed temperatures over time. The temperature sensors may include thermocouples, thermistors, infrared temperature sensors, resistance temperature detectors, or any other desired type of temperature sensor. Voltage sensors included in sensors 220 may be placed across various components in device 200 to detect voltages across those components, which may include, for example, battery 214, processor 202, and GPU 222. The voltage sensors may produce voltage data that includes these detected voltages. The voltage sensors may include capacitive or resistive type voltage sensors, or any other desired type of voltage sensor. Current sensors included in sensors 220 may be placed at inputs and/or outputs of various components in device 200 to detect currents flowing into or out of those components, which may include, for example, battery 214, processor 202, and GPU 222. The current sensors may include Hall Effect sensors, current clamp sensors, resistor-based current sensors, or any other desired type of current sensor. The temperature data, current data, and voltage data described above may, for example, be converted from analog format to digital format by analog-to-digital conversion circuitry in device 200 before being provided to processor 202.

Figure 3A:
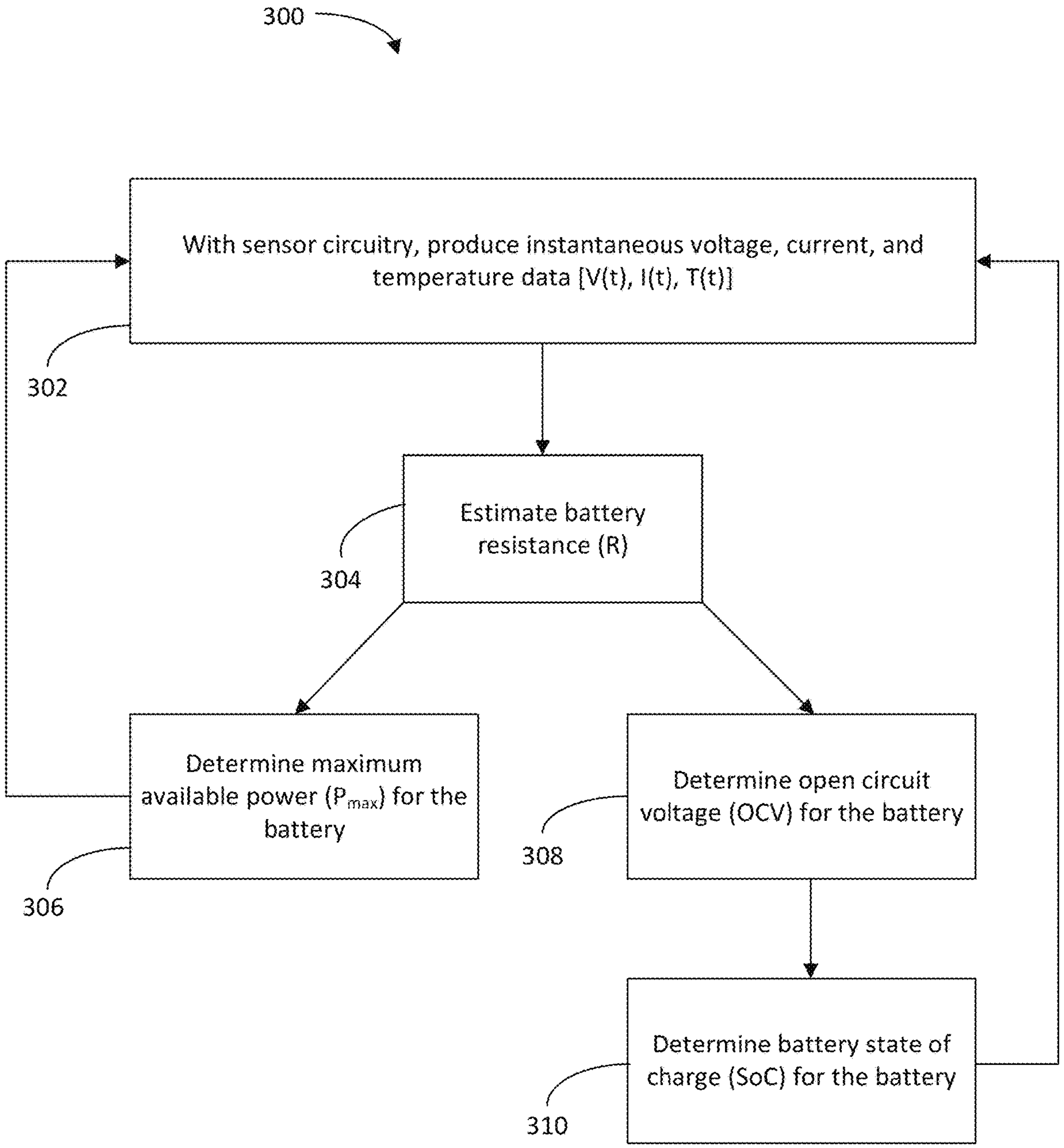
FIG. 3A illustrates an example method for determining an estimated maximum available power and a state of charge for a battery in a device that can be used in accordance with various embodiments.

FIG. 3A illustrates a method 300 by which a device such as device 200 (or any analogous device) may determine a maximum available power and a state of charge (SoC) for a battery such as battery 214. Method 300 may be implemented, for example, by a controller or processor of the device, such as processor 202 of device 200. At step 302, voltage, current, and temperature data are received that respectively include voltages, currents, and temperatures measured for various components in device 200. For example, a voltage sensor in sensor circuitry 220 may continuously measure voltages across terminals of battery 214 in device 200 and may produce voltage data V(t) that includes the measured voltages and the corresponding times at which these voltages are measured. Once received, the voltage data may be stored in non-transient memory 204. Previously measured voltages in voltage data V(t) are referred to herein as historical voltages for battery 214.

A current sensor in sensor circuitry 220 may continuously measure current flowing into or out of a given terminal of battery 214 and may produce current data I(t) that includes the measured currents and the corresponding times at which these currents are measured. The most recently measured current value in current data I(t) is referred to herein as an instantaneous current for battery 214. Other previously measured currents in current data I(t) are referred to herein as historical currents for battery 214.

A temperature sensor in sensor circuitry 220 may continuously measure temperatures at a component (e.g., battery 214 or GPU 222) in device 200 and may produce temperature data T(t) that includes the measured temperatures and the corresponding times at which these temperatures were measured. Processor 202 may sample the measured temperatures from the temperature data at a defined sampling rate. Previously measured temperatures in temperature data T(t) are referred to herein as historical temperatures for battery 214.

The voltage data V(t), current data I(t), and temperature data T(t) produced by sensor circuitry 220 are received by processor 202. It should be noted that other voltage, current, and temperature sensors may be included in sensor circuitry 220 at various locations in device 200, and that these sensors may contribute to the voltage data V(t), current data I(t), and temperature data T(t).

At step 304, the resistance of the battery is estimated. For example, processor 202 may estimate the resistance of battery 214 using one of multiple methods for resistance estimation based on the present conditions of battery 214 and device 200. Methods by which battery resistance may be estimated are described in greater detail below in connection with FIG. 4.

At step 306, the maximum available power ($P_{max}$) of the battery is determined. $P_{max}$ is an estimate of the maximum amount of power that can be drawn from a battery at a given time without allowing the voltage of the battery to fall within a range at which brownout or other power failure events can occur. For example, processor 202 may calculate $P_{max}$ for battery 214 using the following equation:

$$P_{max}=V_t*(V_t-V_{min})/R \quad (1)$$

In equation (1), $V_t$ is the instantaneous terminal voltage measured across the battery (e.g., the most recently detected voltage of the voltage data V(t) produced by the voltage sensor in sensor circuitry 220 in step 302), $V_{min}$ is a predetermined minimum voltage threshold for the battery, indicating the minimum battery voltage at which brownout or other power failure events may begin to occur as a result of power overdraw, and R is the battery resistance that was estimated at step 304. By determining $P_{max}$ in real-time, improvements may be made to battery remaining power estimation, device thermal management, and device power management, as described herein. It should be noted that while equation (1) is described above as being one possible basis for determining $P_{max}$ for battery 214, other equations (e.g., $P_{max}=(I_{max}+(V-V_{min})/R)*V_{min}$, where $I_{max}$ represents a maximum current limit for battery 214) may be used in place of equation (1).

Upon the completion of step 306, method 300 returns to step 302 and the process is repeated. In this way, the $P_{max}$ for the battery may be constantly updated at a given rate (which may be adjustable) to provide a real-time estimation of the maximum available power for the battery. For example, method 300 may iterate every 1 second.

At step 308, the open circuit voltage (OCV) of the battery is determined. OCV is the voltage that is present across two terminals of a battery when the battery is not connected to anything (e.g., when the terminals are in an open circuit). For example, using processor 202, the OCV may be determined or estimated according to the following equation:

$$OCV=V_t-(I_t*R) \quad (2)$$

In equation (2), $V_t$ is the instantaneous terminal voltage measured across the battery (e.g., the most recently detected voltage of the voltage data V(t) produced by the voltage sensor in sensor circuitry 220 in step 302), I(t) is the instantaneous current flowing through a terminal of the battery (e.g., the most recently detected current of the current data I(t) produced by the current sensor in sensor circuitry 220 in step 302), and R is the estimated resistance of battery 214 that was determined in step 304. It should be noted that $I_t$ will have a positive value when the battery is discharging and a negative value when the battery is charging.

At step 310, the SoC for the battery is determined. A battery's SoC is defined herein as the ratio of the remaining charge of the battery to the nominal capacity of the battery, and is generally expressed as a percentage. The SoC for a battery normally cannot be measured directly, but may be determined based on other variables of the battery, such as OCV and resistance. For example, processor 202 may access a look up table (LUT) stored in memory 204 of device 200 in order to determine the SoC for the battery based on the estimated resistance determined in step 304 and based on the OCV determined in step 308. If desired, the SoC for the battery may be determined using an alternative method, such as Coulomb counting.

Upon the completion of step 310, method 300 returns to step 302 and the process is repeated. In this way, the SoC for the battery may be constantly updated at a given rate (which may be adjustable) to provide a real-time estimation of the maximum available power for the battery. For example, method 300 may iterate or be executed every 1 second.

Electronic devices such as device 200 may be placed in a sleep mode to minimize power usage during periods of non-use. During this sleep mode, it may be beneficial to continue to determine SoC so that an accurate value for SoC may be maintained throughout the sleep mode (e.g., so that method 300 may be resumed when the device exits sleep mode and resumes normal operation).

Figure 3B:
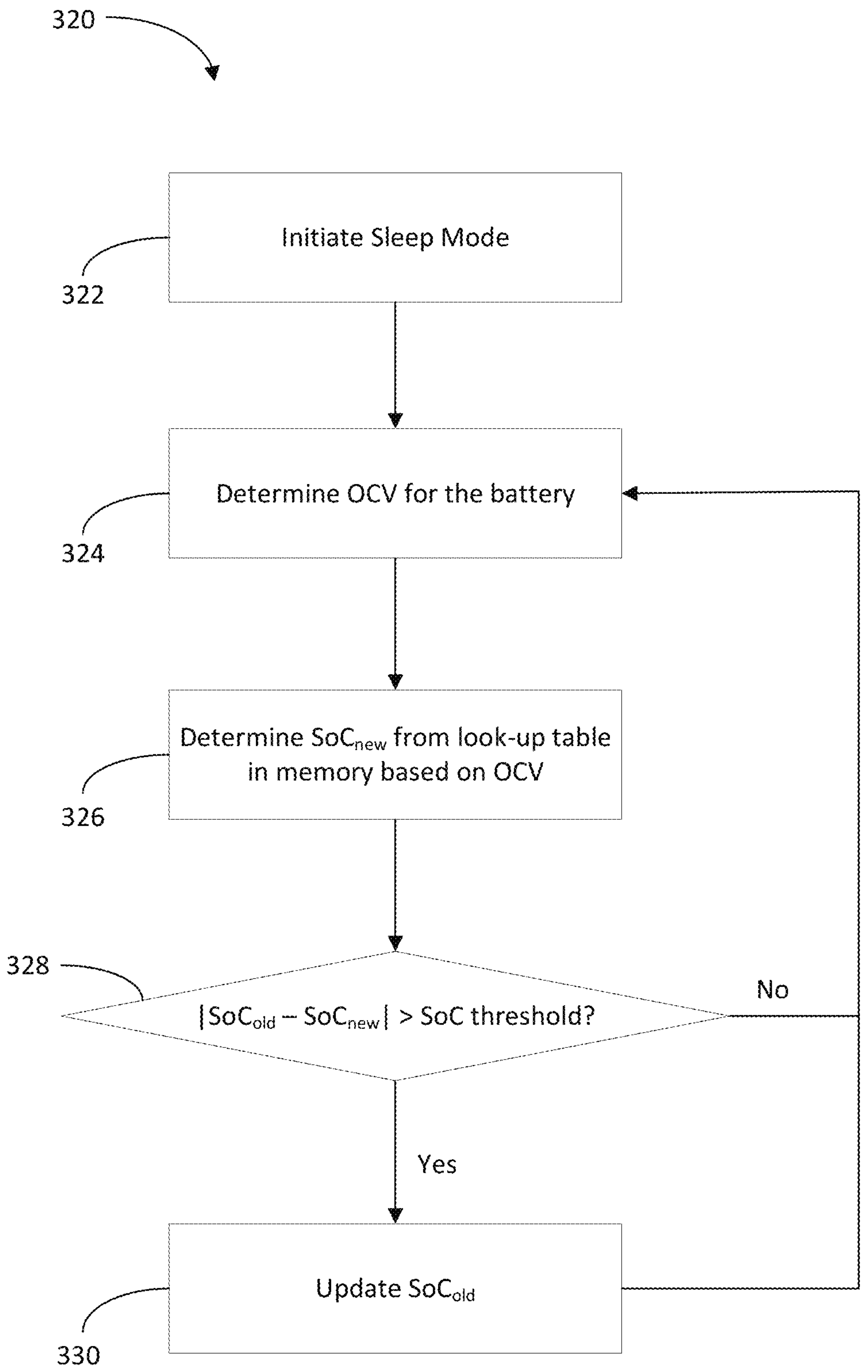
FIG. 3B illustrates an example method for determining a state of charge for a battery in a device while the device is in a sleep mode in accordance with various embodiments.

FIG. 3B illustrates a method 320 by which a device such as device 200 (or any analogous device) may continuously determine the SoC for a battery during a sleep mode of the device.

At step 322, sleep mode is initiated for the device. A sleep mode is a state in which the device is not actively being used and power usage in the device is minimized in order to conserve battery life during this low-use state. For example, processor 202 of device 200 may determine that device 200 has not received any user input for a predetermined amount of time and, in response, may place device 200 in sleep mode. Alternatively, processor 202 may place device 200 into sleep mode in response to a user input associated with the sleep mode.

At step 324 the OCV for the battery is determined, similarly to how OCV for the battery is determined using steps 302, 304, and 308, as described above in connection with FIG. 3A. For example, processor 202 may receive a voltage and a current from sensor circuitry 220 and may determine an estimated resistance for battery 214 as described in connection with step 304 above. The OCV for battery 214 may then be determined by processor 202 using the voltage, current, and estimated resistance as described in connection with step 308 above. The loop that includes steps 324, 326, 328, and 330 may be performed periodically for as long as device 200 is in sleep mode at a rate that is comparatively slower than the rate at which method 300 iterates in order to prolong the battery life of battery 214 during the sleep-mode.

At step 326, a new SoC value, $SoC_{new}$, is determined for the battery. For example, processor 202 may access a LUT stored in memory 204 and may use the LUT to determine $SoC_{new}$ using the estimated resistance and the determined OCV, as described in detail above in connection with step 310. Here, $SoC_{new}$ is used as a placeholder variable so that a present SoC value can be determined for battery 214 without updating the SoC value stored in memory 204, which is referred to in this context as $SoC_{old}$.

At step 328, a magnitude of a difference between $SoC_{old}$ and $SoC_{new}$ is compared to a predetermined SoC threshold value stored in memory 204, for example, using processor 202. If the magnitude of the difference is less than the SoC threshold, the value of $SoC_{old}$ is not updated and method 320 returns to step 324. Otherwise, if the magnitude is greater than the SoC threshold, the value of $SoC_{old}$ is updated to be the value of $SoC_{new}$ at step 330 and method 320 returns to step 324. Steps 324-330 may be repeated continuously until either device 200 exits sleep mode (e.g., due to user interaction or due to lack of battery charge).

Electronic devices such as device 200 may retain SoC information when performing shut-down operations so that when the device is started up again, a previously determined value for SoC may be quickly retrieved from memory.

Figure 3C:
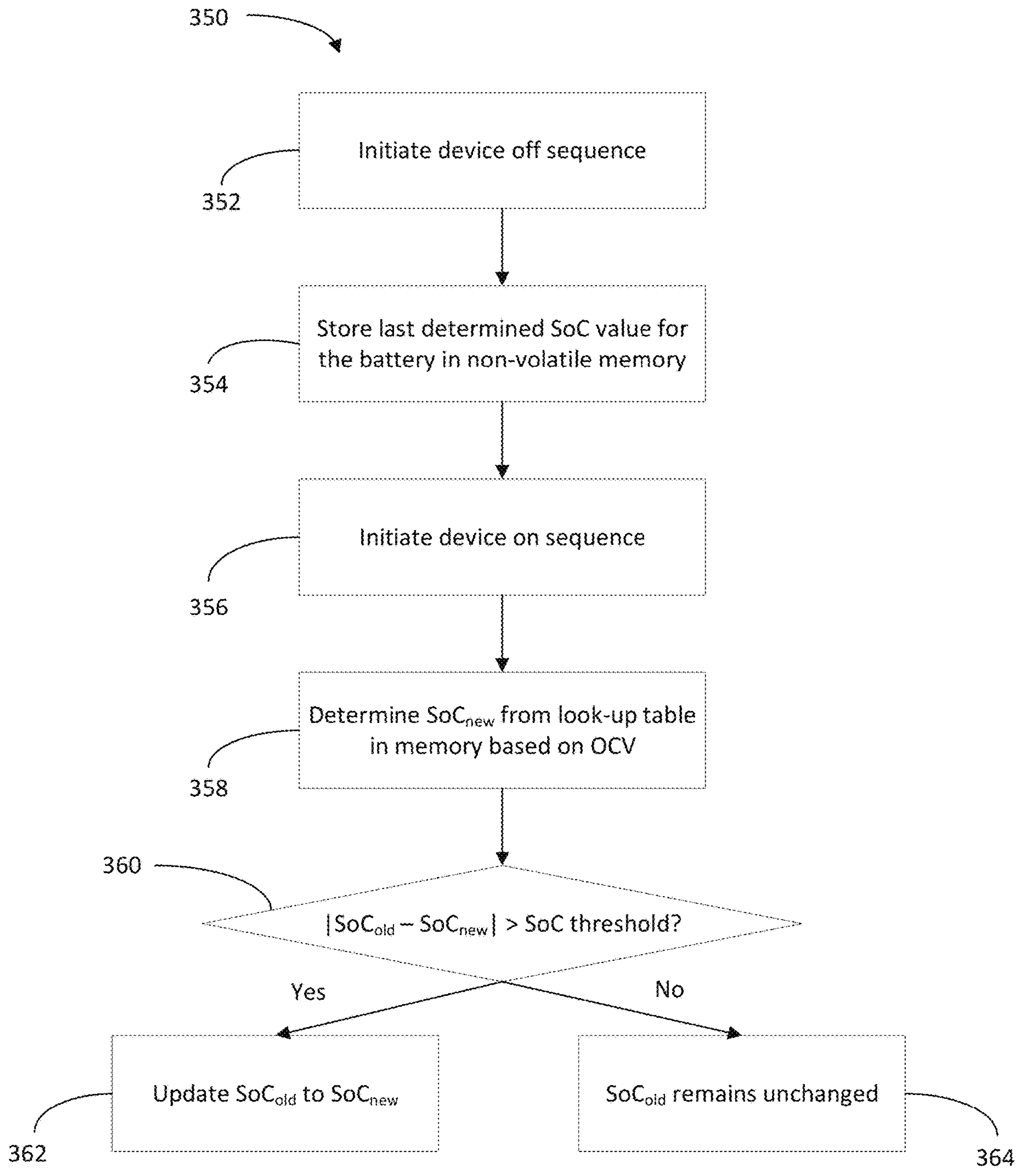
FIG. 3C illustrates an example method for determining a state of charge for a battery in a device when the device is placed into an off state and is then returned to an on state in accordance with various embodiments.

FIG. 3C illustrates a method 350 by which a device such as device 200 (or any analogous device) may update SoC for battery 214 upon turning device 200 on after having previously turned device 200 off.

At step 352, the device may initiate an off sequence. For example, processor 202 of device 200 may receive instructions (e.g., generated in response to user input) indicating that device 200 should be turned off (e.g., powered down) or otherwise set into a mode in which device 200 consumes a minimum amount of energy from the device's battery or power supply.

At step 354, a most recently determined SoC for the battery (e.g., as determined using method 300 of FIG. 3A), may be stored in a non-volatile memory of the device before the device is turned off. For example, processor 202 may store the SoC value in memory 204 of device 200 before device 200 is turned off so that the stored value can be retrieved from memory 204 after device is turned back on.

At step 356, the device may initiate an on sequence. For example, processor 202 of device 200 may begin performing boot-up sequences or processes associated with turning on device 200 (e.g., in response to a user input such as the user pressing a power button on device 200).

At step 358, a new SoC value, $SoC_{new}$, is determined for the battery in the device. For example, determining $SoC_{new}$ may involve performing steps 302, 304, 308, and 310 described above in connection with FIG. 3A. Processor 202 may receive a voltage and a current from sensor circuitry 220 and may determine an estimated resistance for battery 214 as described in connection with step 304 above. The OCV for battery 214 may then be determined by processor 202 using the voltage, current, and estimated resistance as described in connection with step 308 above. Processor 202 may then access a LUT stored in memory 204 and may use the LUT to determine $SoC_{new}$ using the estimated resistance and the determined OCV, as described in detail above in connection with step 310. Here, $SoC_{new}$ is used as a placeholder variable so that a present SoC value can be determined for battery 214 without updating the SoC value that was stored in memory 204 at step 354, which is referred to in this context as $SoC_{old}$.

At step 360, a magnitude of a difference between $SoC_{old}$ and $SoC_{new}$ is compared to a predetermined SoC threshold value stored in memory 204, for example, using processor 202. If the magnitude is less than the SoC threshold, the value of $SoC_{old}$ is not updated at step 364. Otherwise, if the magnitude is greater than the SoC threshold, the value of $SoC_{old}$ is updated to be the value of $SoC_{new}$ at step 362.

Figure 4:
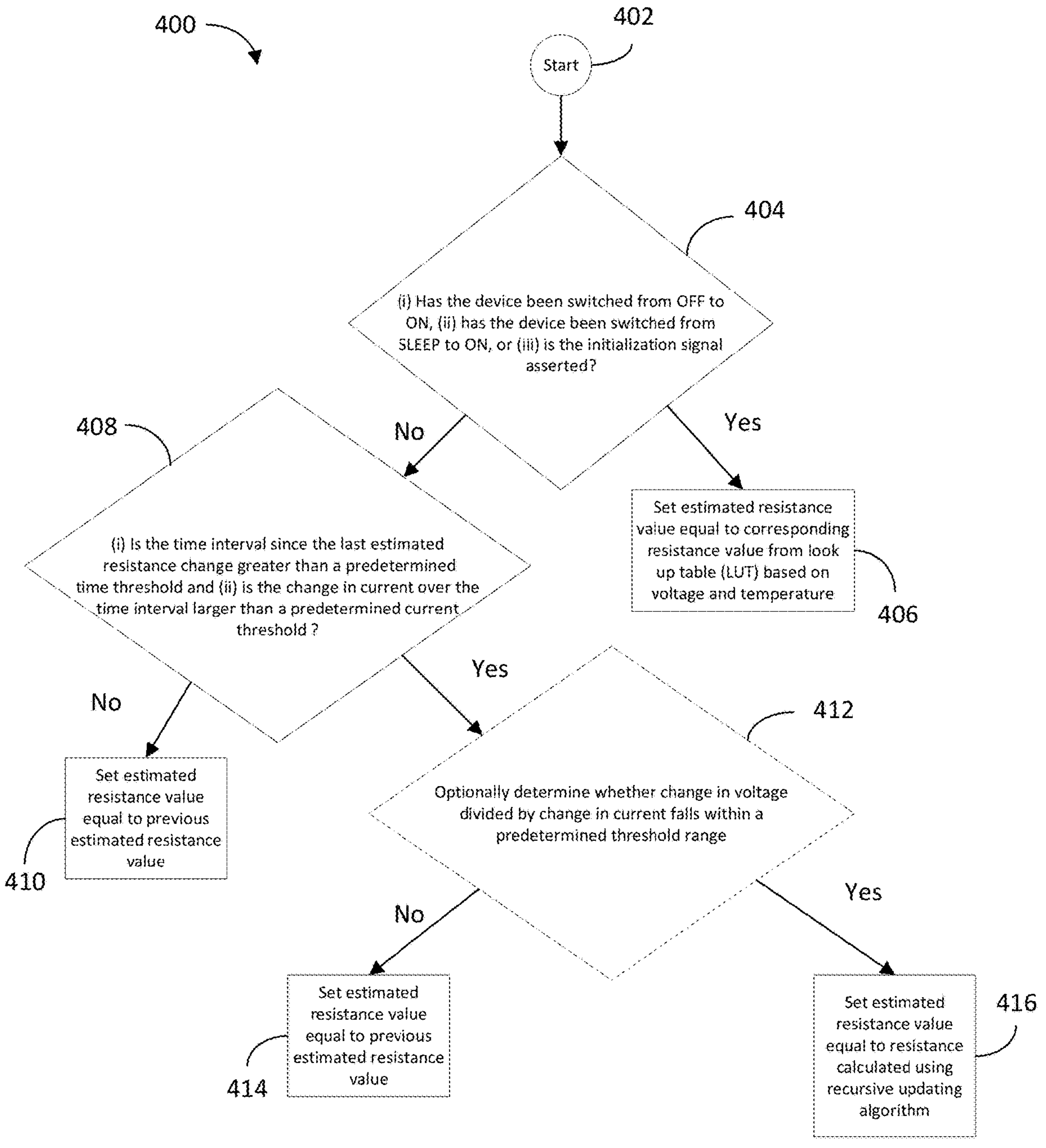
FIG. 4 illustrates an example method for estimating resistance of a battery in a device that can be used in accordance with various embodiments.

FIG. 4 illustrates a method 400 by which a device such as device 200 (or any analogous device) may estimate the resistance of a battery such as battery 214. Herein, battery resistance (e.g., the resistance of battery 214) is the internal resistance of the battery that opposes the flow of current within the battery. There are three basic components that contribute to the internal resistance of a battery, electronic resistance, ionic resistance, and diffusion resistance. The electronic resistance includes the resistivity of materials that make up the battery, such as metal covers and conductive internal components. The ionic resistance is the resistance to current flow within the battery due to various electrochemical factors such as conductivity of the electrolyte in the battery, ion mobility, and electrode surface area. The diffusion resistance is the resistance to current flow within the battery due to the hindrance of the ion transports in the solid phase.

At step 402, the process begins. Step 402 may, for example, correspond to the beginning of step 304 shown in FIG. 3A.

At step 404, it is optionally determined whether the device is in an initialized state in which there is no available historical resistance data for battery 214. When the device is first initialized, historical resistance data needed for performing other operations (e.g., those that utilize Kalman filtering) to calculate battery resistance may not yet be stored in memory. Thus, it may be necessary to determine whether the device has been initialized so that an appropriate alternative method (e.g., non-recursive) for estimating battery resistance may be implemented when the device is first initialized. For example, processor 202 may optionally determine whether device 200 has been switched from an off state to an on state, whether device 200 has been switched from a sleep state to the on state, which may indicate that historical values, such as parameters S1 and S2, aren't defined and a different approach for estimating resistance is required and whether an initialization signal in device 200 has been asserted. The initialization signal may be, for example, asserted during diagnostic assessment of device 200 and otherwise may not be asserted during normal operation of device 200. If any of the above conditionals are true, method 400 proceeds to step 406. Otherwise, the process proceeds to step 408.

At step 406, in response to determining that the device is in the initialized state (e.g., that any of the conditionals of step 404 are true), an estimated resistance value is produced by comparing voltage and temperature data for the battery to voltage-temperature pairs in a predefined look-up-table (LUT). For example, processor 202 may access a LUT stored in memory 204, which includes a table of predetermined resistances each corresponding to a given temperature and a given voltage (e.g., a voltage-temperature pair). An example LUT that may be used in step 406 is shown as Table 1 below:

TABLE 1

| | 0° C. | 10° C. | 20° C. | 40° C. | 60° C. |
|---|---|---|---|---|---|
| 4.3 V | 0.22 Ω | 0.12 Ω | 0.10 Ω | 0.14 Ω | 0.16 Ω |
| 3.8 V | 0.21 Ω | 0.11 Ω | 0.09 Ω | 0.15 Ω | 0.17 Ω |
| 3.4 V | 0.20 Ω | 0.11 Ω | 0.08 Ω | 0.13 Ω | 0.15 Ω |

As shown in Table 1, temperatures are shown in degrees Celsius, voltages are shown in volts, and resistance values are shown in ohms (a). An example of a voltage-temperature pair is 4.3 V and 10° C., which have a corresponding resistance value of 0.12Ω.

Processor 202 may then determine which resistance value of the LUT corresponds to the instant voltage and temperature of battery 214, as identified from the voltage data and the temperature data, and this resistance value will then be selected as the estimated resistance R for battery 214. In some cases, the instant voltage and temperature of battery 214 may not have exact matches in the LUT, in which case interpolation may be performed between resistance values of the LUT that are associated with the voltage-temperature pairs closest to the instant voltage and temperature of battery 214. As an example of performing interpolation with the LUT of Table 1, the instant voltage may be 3.6V and the temperature may be 5° C. The closest corresponding resistance values 0.21Ω, 0.20Ω, 0.11Ω, 0.11Ω may be averaged together in order to produce an interpolated estimated resistance value of 0.1575Ω.

At step 408, in response to determining that the device is not in an initialized state (e.g., that all of the conditionals of step 404 are not true), it is determined whether the device is in a benign state. Here, "benign state" refers to a device state in which at least an amount of time corresponding to a predetermined time threshold has passed since a most recent estimated resistance update for the battery, and in which a change in current since the last estimated resistance update for the battery exceeds a predetermined current change threshold. For example, at time $t_1$ the estimated resistance R for battery 214 may be updated to a new value as part of an estimated resistance update according to the process described in connection with step 416 below. At time $t_2$, processor 202 may perform step 414 to assess whether a difference between time $t_2$ and time $t_1$ exceeds the predetermined time threshold, and to analyze current data I(t) to determine whether a difference between current $I(t_2)$ (e.g., the measured current of battery 214 at time $t_2$) and current $I(t_1)$ (e.g., the measured current of battery 214 at time $t_1$) exceeds the predetermined current change threshold.

This may prevent resistance estimates from being updated too quickly and from being updated without a significant change in current, which could increase an amount of noise or uncertainty in the estimated resistance value. The time difference between times $t_1$ and $t_2$ may be, for example, tracked using a counter implemented in software, with the counter value being incremented every microsecond or millisecond and being reset to zero upon the successful updating of the estimated resistance of battery 214. The counter value may be compared to the predetermined time threshold and the predetermined current threshold, which may be stored in memory 204. If the difference between times $t_1$ and $t_2$ exceeds the predetermined time threshold and if the difference between currents $I(t_1)$ and $I(t_2)$ exceed the predetermined current change threshold, method 400 proceeds to step 412. Otherwise, the process proceeds to step 410.

At step 410, in response to determining that the device is not in a benign state (e.g., that either of the conditionals of step 408 are not true), the estimated resistance R of the battery 214 remains at the old (previous) estimated resistance value (e.g., the estimated battery resistance at $t_1$). In other words, the estimated resistance R of the battery 214 remains unchanged.

At step 412, in response to determining that the device is in the benign state (e.g., that both of the conditionals of step 408 are true), it is optionally determined whether a change in voltage during the time interval from time $t_1$ to time $t_2$ divided by a change in current during the time interval from time $t_1$ to time $t_2$ falls within a predetermined threshold range. For example, processor 202 may identify the difference between voltages $V(t_1)$ and $V(t_2)$ (e.g., the voltage of battery 214 measured at time $t_1$ and the voltage of the battery measured at time $t_2$) and the difference between the currents $I(t_1)$ and $I(t_2)$ (e.g., the current of battery 214 measured at time $t_1$ and the current of battery 214 measured at time $t_2$). The difference between $V(t_1)$ and $V(t_2)$ is represented here as ΔV, and the difference between $I(t_1)$ and $I(t_2)$ is represented here as ΔI. Processor 202 may then determine ΔV divided by ΔI, and the result of this division may then be compared to the predetermined threshold range which may, for example, be stored in memory 204. If ΔV divided by ΔI is less than or greater than the predetermined threshold range, method 400 proceeds to step 414 at which the estimated resistance R remains the previously estimated resistance (e.g., the estimated resistance determined at $t_1$, similar to step 410 described above). If the ΔV divided by ΔI falls within the predetermined threshold range, method 400 proceeds to step 416.

At step 416, in response to determining that ΔV divided by ΔI is within the predetermined threshold range, a recursive updating algorithm is used to calculate a new estimated resistance R for battery 214. For example, processor 202 may use a recursive updating algorithm to determine a new estimated resistance R for battery 214.

In an embodiment, the recursive updating algorithm may use Kalman filtering to recursively update the estimated resistance R of battery 214. While Kalman filtering is used here as an illustrative preferred example, it should be noted that, if desired, any applicable method of filtering, such as least-square method-with-adaptive-weight (LSMAW), may be used to recursively estimate resistance of battery 214. Two parameters, S1 and S2, may be set to a value of zero when device 200 is initialized. Parameters S1 and S2 may be updated during the execution of the recursive updating algorithm according to the following equations:

$$S1=FF*S1+\Delta I*\Delta I \tag{3}$$

$$S2=FF*S2+\Delta I*\Delta V \tag{4}$$

In equation (3), a product of the previous value of parameter S1 is multiplied by a forgetting factor FF, which is generally a value less than one and greater than zero and which is used to weight the previous value of parameter S1. The product of this multiplication is then added to the square of ΔI, which is the change in current output by battery 214 over the time interval from time $t_1$ to time $t_2$ described above in connection with step 408.

In equation (4), a product of the previous value of parameter S2 is multiplied by the forgetting factor FF, which is generally a value less than one and greater than zero and which is used to weight the previous value of parameter S2. The product of this multiplication is then added to the product of ΔI and ΔV, which is the change in terminal voltage of battery 214 over the time interval from time $t_1$ to time $t_2$ described above in connection with step 408.

As described above, the magnitude of the forgetting factor FF defines a weight assigned to parameters S1 and S2, which represent cumulative previously estimated resistances for battery 214 (e.g., as historical resistance data) and which are used to estimate a present resistance for battery 214. Thus, when the forgetting factor FF is large (closer to 1), previously estimated resistances contribute more to the determination of the estimated resistance R of battery 214 compared to when the forgetting factor FF is small (closer to 0). When the forgetting factor FF is large, the estimated resistance R responds less quickly to changes in the voltage or current of battery 214 compared to when the forgetting factor FF is small. This reduction in responsiveness may be beneficial in that transitory spikes or dips in the voltage and current of battery 214 will not have as much of an impact on the estimated resistance R compared to when the forgetting factor FF is small, resulting in a less noisy estimated resistance R when using a larger value for the forgetting factor FF. From another perspective, during periods in which voltage and current of battery 214 are changing rapidly, it may be beneficial to use a smaller forgetting factor FF when determining estimated battery resistance R so that the battery resistance R may accurately reflect the actual resistance of the battery more quickly.

While some embodiments may use a static forgetting factor FF when determining estimated battery resistance R, others may use a dynamic forgetting factor FF that is periodically updated. For example, the dynamic forgetting factor FF may be assigned a smaller value, such as 0.1, when it is detected that either of ΔI or ΔV are sufficiently large (e.g., as defined by predetermined thresholds) so that the estimated resistance R can change value comparatively quickly in order to account for the large changes in voltage or current of battery 214. The dynamic forgetting factor FF may also be assigned this smaller value when few previously estimated resistances for battery 214 have been determined since device initialization, as it may not be ideal to provide a comparatively large amount of weight to historical resistance data that is only based on a small number of previously estimated resistances. When it is detected that both ΔI and ΔV are sufficiently small (e.g., as defined by the predetermined thresholds), the dynamic forgetting factor FF may be assigned a larger value, such as 0.999, so that the estimated resistance R is more stable over time and is less susceptible to noise.

Once parameters S1 and S2 have been updated, the estimated resistance R of battery 214 may be updated with a new estimated resistance value according to the following equation:

$$R=S2/S1 \quad (5)$$

In equation (5), the new estimated resistance value is defined as the quotient of S2 and S1 and is applied to the estimated resistance R of battery 214. By using the recursively updating algorithm to calculate the new estimated resistance value for battery 214, the estimated maximum available power ($P_{max}$) may be more accurate compared to using a LUT alone or compared to performing a direct resistance calculation from a quotient of the instantaneous current and the instantaneous terminal voltage.

Figure 5:
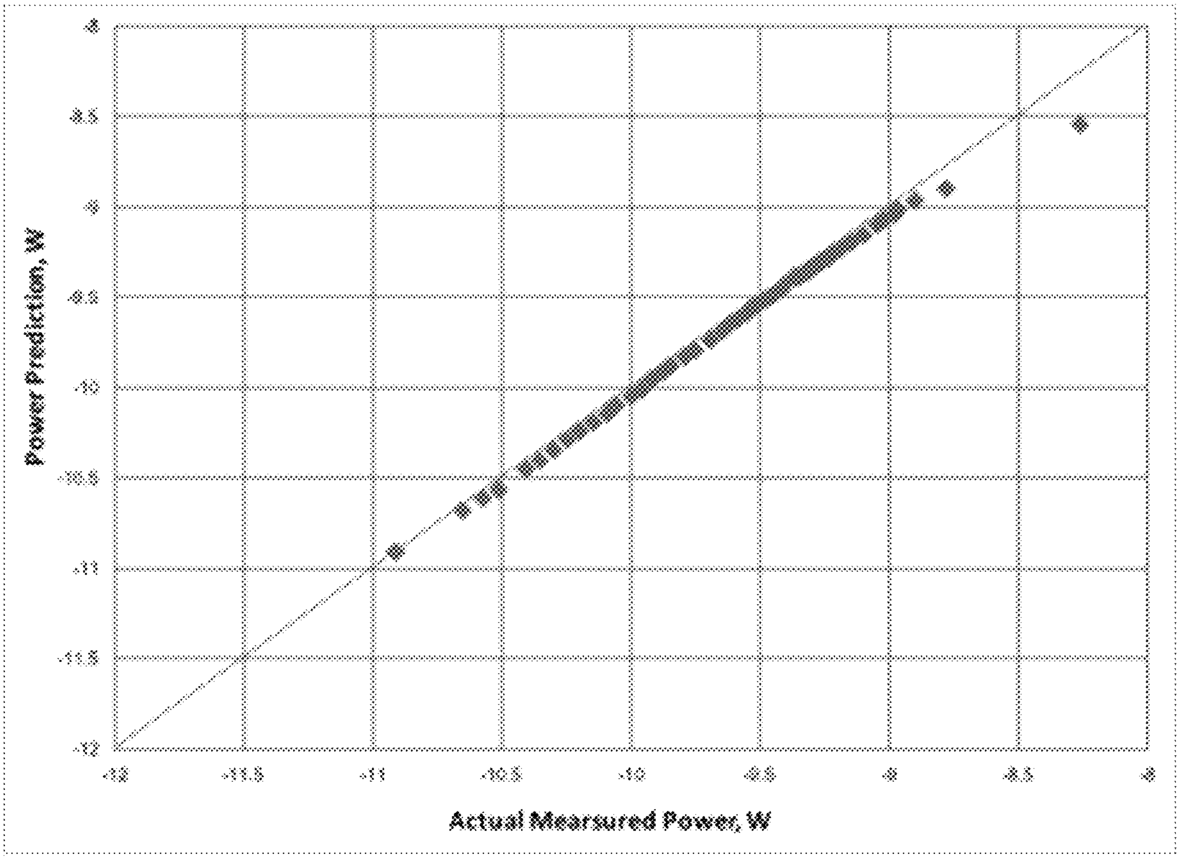
FIG. 5 illustrates an example graph of actual measured power vs. estimated maximum available power for a battery in a device.

FIG. 5 shows a graph 500 illustrating estimated maximum available power vs. actual measured maximum available power for a battery such as battery 214 using methods for maximum available power estimation described above in connection with FIGS. 3A and 4. To produce graph 500, a battery was connected to a battery cycling hardware machine to simulate a use case scenario. Periodically, current pulses of 2.85 A were required of the battery in order to force the battery to provide its maximum available power (e.g., simulating power spikes). The actual measured power of the simulated power spikes were compared to the estimated maximum available power to show the accuracy of methods 3A and 4 for predicting maximum available power of a battery.

Figure 6:
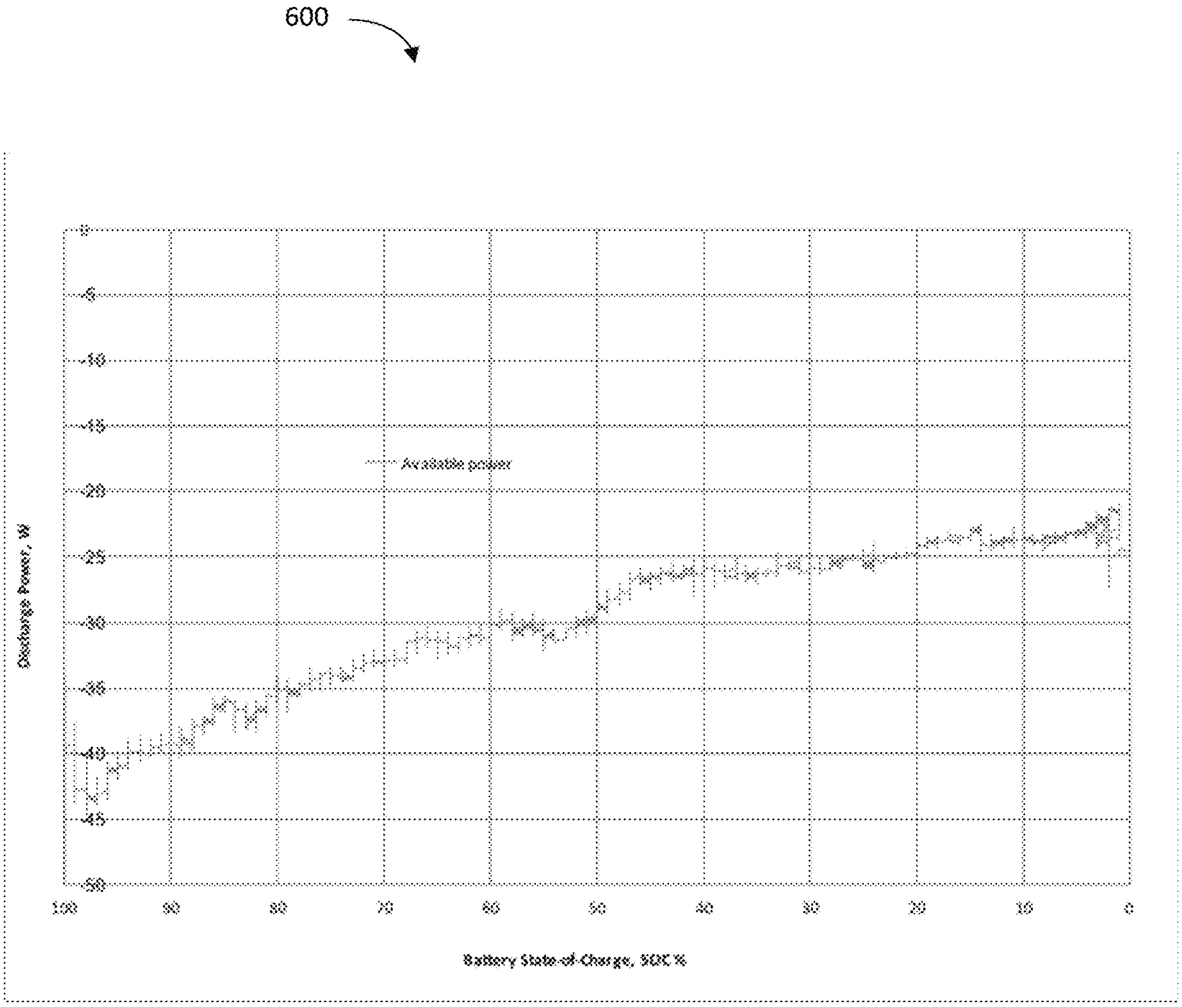
FIG. 6 illustrates an example graph of battery state of charge vs. estimated maximum available power for a battery in a device.

FIG. 6 shows a graph 600 showing the estimated available discharge power (e.g., estimated maximum available power) for a battery as a function of battery SoC (e.g., using methods for maximum available power estimation described above in connection with FIGS. 3A and 4). The battery goes from being fully charged when SoC is at 100% to being fully discharged when SoC is at 0% (negative values in the graph indicate the available power during discharge). As shown, the estimated maximum available power is non-linear. As the battery discharges, the magnitude of the estimated maximum available power generally decreases, going from roughly −50 W when SoC is at 100% to roughly −25 W when SoC is at 0%. This trend indicates that less maximum power may be drawn from the battery as the SoC of the battery decreases (e.g., as the battery discharges).

Figure 7:
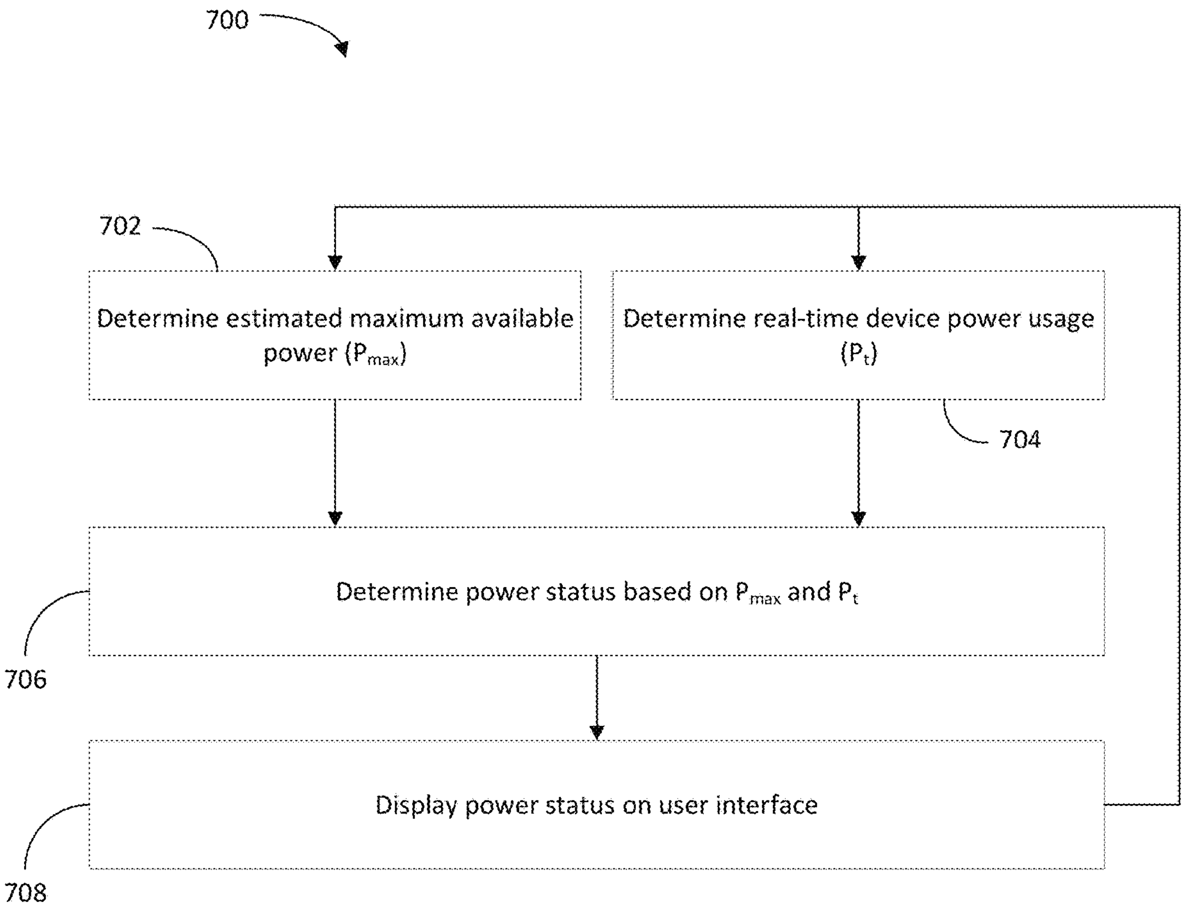
FIG. 7 illustrates an example method for determining and displaying a power status value for a battery in a device that can be used in accordance with various embodiments.

FIG. 7 illustrates a method 700 by which a power status value for a battery in a device such as battery 214 in device 200 is determined and displayed on a user interface on a screen such as display screen 102 or display element 206. Herein, the power status value for a battery in a device is defined as a ratio of total power usage of the device to an estimated maximum available power for the battery.

At step 702, estimated maximum available power ($P_{max}$) for a battery in a device is determined. For example, with processor 202, $P_{max}$ may be determined for battery 214 in device 200 according to methods 300 and 400 of FIGS. 3A and 4, described above.

At step 704, real-time device power usage (Pt) is determined for the device. For example, using processor 202, an instantaneous voltage across terminals of battery 214 may be determined (e.g., sampled) from the voltage data produced by sensor circuitry 220 and an instantaneous current output by battery 214 may be determined (e.g., sampled) from the current data produced by sensor circuitry 220. With processor 202, the instantaneous voltage may be multiplied by the instantaneous current in order to produce the real-time device power usage Pt, representing the total power usage for the device at the time the instantaneous voltage and instantaneous current are measured.

At step 706, the power status value for the battery in the device is determined based on $P_{max}$ and $P_t$. The power status value is an indicator of how close the value of $P_t$ is to the value of $P_{max}$ (e.g., how close real-time power usage for the device is to the estimated maximum available power for the battery in the device), and, for example, may represent $P_t$ as a percentage of $P_{max}$. The power status value may be important for determining when power management operations need to be performed in the device to prevent the real-time power usage for the device from exceeding the estimated maximum available power. For example, processor 202 may determine the power status value for battery 214 by dividing $P_t$ by $P_{max}$ to produce a quotient, and then multiplying this quotient by 100 so that the power status value for the battery represents $P_t$ as a percentage of $P_{max}$.

At step 708, the power status value for the battery is displayed on a user interface of the device. For example, processor 202 may instruct display element 206 to show the power status value as part of a user interface shown on display element 206. The power status value may, for example, be displayed via a power usage gauge, which may display one or more non-numeric visual indications of how close $P_t$ is to $P_{max}$ concurrently with the display of the power status value itself. For example, the power usage gauge may fill to a percentage that corresponds to $P_t$ as a percentage of $P_{max}$.

Displaying the power status value for the battery to a user via an electronic display, as described above, may be advantageous in that by knowing the power status, the user may alter their behavior or device usage in order to lower the real-time power usage of the device when it becomes clear based on the power status value that the real-time device power usage is approaching the estimated maximum available power.

In some cases, processor 202 may optionally instruct power management module 216 to reduce power usage of the device in response to detecting that real-time power usage of device 200 is approaching the maximum available power for battery 214. For example, the brightness of display component 206 may be dimmed, WiFi and GPS functions may be disabled, a volume output by speakers of device 200 may be reduced, and operating frequencies of processor 202 and GPU 222 may be reduced by power management module 216 in order to reduce the real-time power usage of device 200. By performing power management operations in situations where real-time power usage of device 200 is approaching the estimated maximum available power for battery 214, the frequency at which brownout and other power failure events occur for device 200 may be reduced.

Upon the completion of step 708, method 700 may return to steps 702 and 704, which may be executed in parallel, and the process repeats so that the power status value is continuously updated.

Figure 8:
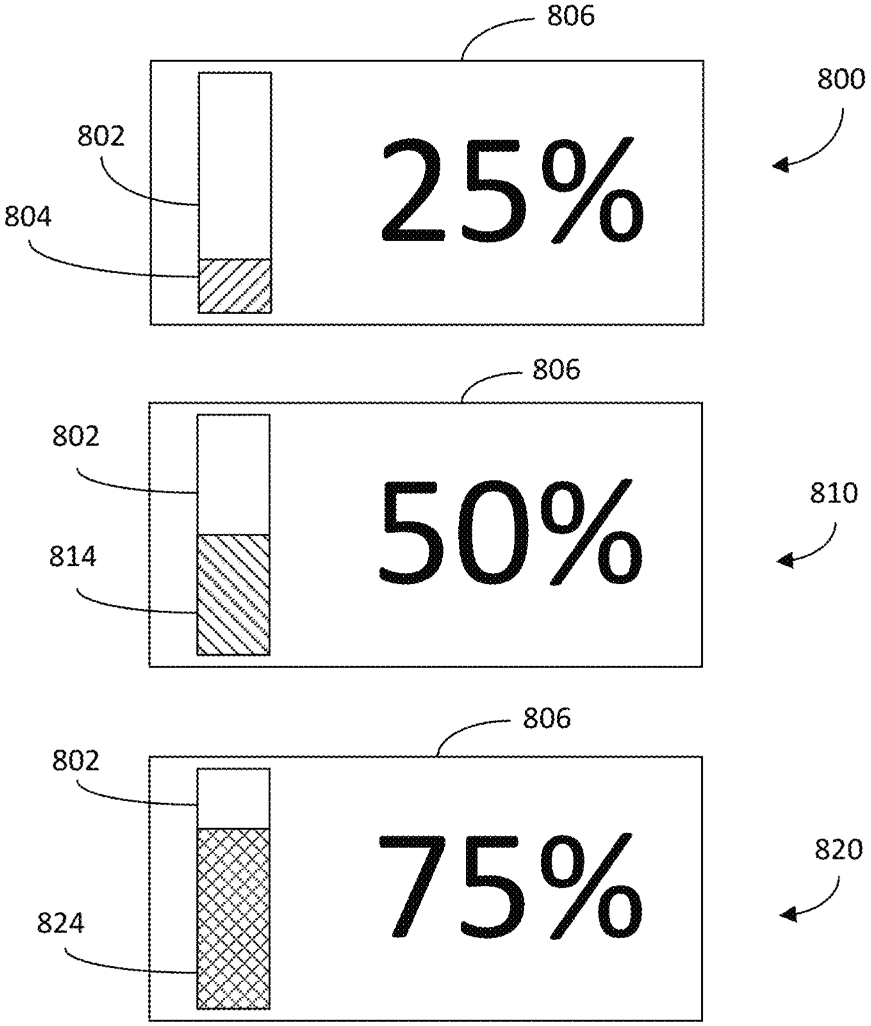
FIG. 8 illustrates different states of an example power gauge that can be displayed on a screen as part of the method of FIG. 7 in accordance with various embodiments.

FIG. 8 illustrates three possible states of a power usage gauge of the type described above in connection with FIG. 7, which may be displayed to a user via display element 206 of device 200. Power usage gauge 806 includes a numerical indicator and a gauge 802, each representing the real-time power usage of device 200 as a percentage of the estimated maximum available power for battery 214.

In state 800, the real-time power usage of device 200 is 25% of the estimated maximum available power for battery 214. Thus, the numerical indicator shows 25% and gauge 802 is 25% full as indicated by fill 804.

In state 810, the real-time power usage of device 200 is 50% of the estimated maximum available power for battery 214. Thus, the numerical indicator shows 50% and gauge 802 is 50% full as indicated by fill 814.

In state 820, the real-time power usage of device 200 is 75% of the estimated maximum available power for battery 214. Thus, the numerical indicator shows 75% and gauge 802 is 25% full as indicated by fill 824.

It should be noted that different hatch patterns are used to represent fills 804, 814, and 824. These differences in pattern illustrate that fill 804 may appear differently to a user compared to fills 814 and 824, and fill 814 may appear differently to a user compared to fills 804 and 824. For example, fill 804 may be displayed as green in order to convey to the user that the real-time power usage of device 200 is currently a relatively low percentage the estimated maximum available power of device 200. Fill 814 may be displayed as yellow in order to convey to the user that the real-time power usage of device 200 is currently a moderate percentage of the estimated maximum available power of device 200. Fill 824 may be displayed as red in order to convey to the user that the real-time power usage of device 200 is currently a relatively high percentage of the estimated maximum available power of device 200. The different colors described above for fills 804, 814, and 824 are merely illustrative, and any desired identifying trait can be used to distinguish fills 804, 814, and 824 from one another in representing different relative power usage conditions for device 200.

In some cases, a device such as device 200 may be utilized by a user to perform a time-constrained task, such as watching a movie or reading an e-book. In such scenarios, the task being performed will have an amount of time that is required until the task is completed. For example, if a user is watching a movie on device 200, there will be an identifiable amount of time required for the movie to complete, as determined by the remaining run-time of the movie. However, battery 214 in device 200 may not have sufficient charge remaining, given the current power usage of device 200, to continue to power device 200 through the completion of the movie watching task. It may therefore be advantageous to extend the device run-time of a device by implementing power management functions that reduce the power usage of the device by disabling certain components or functions of the device or by limiting some of the functions of the device. By extending device run-time in this way, the device may be able to complete time-constrained tasks that would otherwise not have been able to be completed by the device before the device shut down from lack of power.

Figure 9:
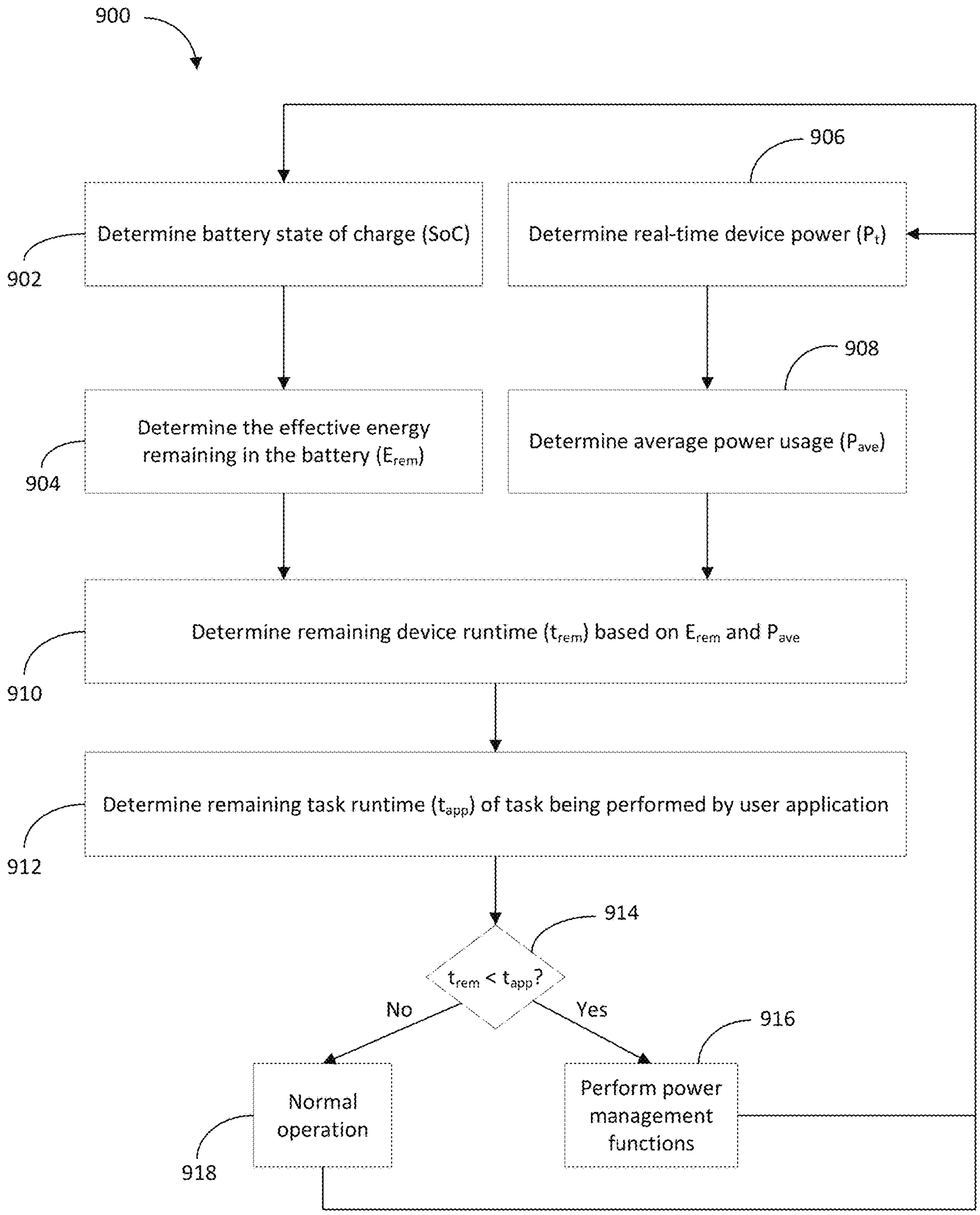
FIG. 9 illustrates an example method for extending the run-time of a device to meet or exceed the task run-time of a task being performed by an application running on the device that can be used in accordance with various embodiments.

FIG. 9 illustrates a method 900 by which a remaining device run-time of a device such as device 200, corresponding to an amount of time remaining at the device's current power usage before the device is expected to shut down as a result of lack of power, may be extended or adjusted for instances in which a user is attempting to perform a task with an application, where a remaining task run-time, corresponding to an amount of time needed for the application to complete the task, exceeds the remaining device run-time. At step 902, SoC for a battery in a device is determined. For example, with processor 202, SoC may be determined for battery 214 in device 200 according to method 300 of FIG. 3A, described above.

At step 904, the effective energy remaining $E_{rem}$ in the battery may be determined. For example, processor 202 may determine the effective energy remaining $E_{rem}$ in battery 214 by multiplying the SoC of battery 214 (e.g., as continuously determined in step 310 of FIG. 3A) by a maximum capacity of battery 214, which may be a known, static value for battery 214 representing the maximum amount of charge held by battery 214 when battery 214 is fully charged, and which is measured in Ampere hours. Processor 202 may then multiply the product of the SoC and the maximum capacity may then be multiplied by a most recent voltage of the voltage data V(t) that is measured by the voltage sensor in sensor circuitry 220 to produce the effective energy remaining $E_{rem}$ in battery 214, represented in Watt hours.

At step 906, real-time device power usage ($P_t$) is determined for the device. For example, using processor 202, an instantaneous voltage across terminals of battery 214 may be determined (e.g., sampled) from the voltage data produced by sensor circuitry 220 and an instantaneous current output by battery 214 may be determined (e.g., sampled) from the current data produced by sensor circuitry 220. With processor 202, the instantaneous voltage value may be multiplied by the instantaneous current value in order to produce the real-time device power usage $P_t$. The determined value for $P_t$ may be stored in memory 204 of device 200 along with other previous values for $P_t$ as power usage data for use in calculating power averages in future iterations of method 900.

At step 908, multiple values for $P_t$ across a predetermined time period are accessed from memory and are averaged to determine average power usage $P_{ave}$ for the predetermined time period. For example, processor 202 may perform averaging operations on the present and previous values for $P_t$ that are stored in memory 204 across the predetermined time period to produce a value for the average power usage $P_{ave}$ for device 200 across the predetermined time period. By averaging recent $P_t$ values in this way, the impact of noisy or outlier $P_t$ readings may be reduced when calculating the remaining device run-time at step 910. As shown, steps 902 and 904 may be performed in parallel with steps 906 and 908, if desired.

At step 910, the remaining device run-time ($t_{rem}$) for the device is determined based on $E_{rem}$ and $P_{ave}$. For example, processor 202 may divide $E_{rem}$ by $P_{ave}$ to produce a value that represents an estimated remaining device run-time for device 200. It is important to note that the estimated remaining device run-time will change according to changes in device power usage (e.g., as device power usage decreases, estimated remaining device run-time will increase). As described above, the estimated remaining device run-time indicates how much longer device 200 is expected to run before experiencing a power failure due at least to insufficient battery charge.

At step 912, a remaining task run-time ($t_{app}$) of a task being performed by a user application that is being used to perform a time-constrained task is determined. The remaining task run-time for a task being performed by given user application refers here to an amount of time that is required for a time-constrained task being performed by the application to be completed. For example, processor 202 may identify the remaining task run-time of a movie application running on device 200 to display a movie on display module 206, where $t_{app}$ represents the amount of time remaining until the movie is over. As another example, processor 202 may identify the remaining task run-time of an e-reader application running on device 200 to display an e-book on display 206, where $t_{app}$ represents the amount of time remaining until a chapter is complete or until the e-book is complete based on a detected or estimated reading-speed of the user. In each of the above examples, processor 202 may access one or more look-up tables in memory 204 in order to determine the type of task being performed by the given application and the remaining time needed to perform that task, which, for example, may be based on predicted user behavior generated by a learning algorithm executed by processor 202.

At step 914, $t_{rem}$ is compared to $t_{app}$ to determine whether $t_{rem}$ is greater than $t_{app}$. For example, processor 202 may execute comparator functions on $t_{rem}$ and $t_{app}$ to determine which is larger. If $t_{rem}$ is larger than $t_{app}$, method 900 proceeds to step 918 at which normal operation of device 200 continues and method 900 repeats from the beginning. If $t_{app}$ is larger than $t_{rem}$, method 900 proceeds to step 916.

At step 916, in response to determining that $t_{app}$ is larger than $t_{rem}$, power management operations are performed on the device. For example, processor 202 may instruct power management module 216 to perform one or more power management operations on device 200. These power management operations may include throttling the performance of or disabling operations being performed by or applications running on device 200 including dimming the brightness of display component 206, disabling WiFi and GPS functions, reducing a volume at which sound is output by speakers of device 200, and reducing operating frequencies of processor 202 and GPU 222 with power management module 216 in order to reduce the real-time power usage of device 200 and thereby increase remaining device run-time $t_{rem}$. In some cases, power management module 216 may even reduce the framerate of a movie being watched on device 200 in order to reduce power usage and thereby increase remaining device run-time $t_{rem}$.

The order in which device operations (e.g., functions or applications) are throttled or disabled by power management module 216 may be determined based on individual power weight values assigned to each of operations. A power weight value, as used here, is a value assigned to a particular operation based on the power usage of that operation, and (optionally) based on a task-based priority determined (e.g., by processor 202) for that operation. The power weight values may be stored in memory 204 and may be static (e.g., predetermined) or may be dynamically updated based on changes in power usage or analyzed user habits. The power weight value for a given operation may be, for example, determined by processor 202 or by power management module 216 as a ratio of the measured real-time power usage of the given operation to the estimated maximum available power for battery 214 in device 200. Operations having higher measured real-time power usages may be assigned higher power weight values, and therefore have higher priority for power management operations (e.g., throttling), while operations having lower measured real-time power usages may be given lower power weight values and therefore have lower priority for power management operations (e.g., throttling). For example, a first operation being performed by device 200 may be assigned a power weight value of twenty, while a second operation being performed by device 200 may be assigned a power weight value of ten. The power management circuitry 216 will determine that the power weight value of the first operation is higher than the power weight value of the second operation and will then disable, throttle, or otherwise modify the first operation to reduce the power usage of the first operation before power management circuitry 216 disables or throttles the second operation. The power weight value of a given operation may also be determined based on whether that operation is being actively used in an activity (e.g., the task being performed by the given application) being performed on device 200 (e.g., by a user). For example, a user may be playing a graphics-intensive game on device 200, which relies on the performance of GPU 222. While GPU 222 may be a major contributor to power usage in device 200 in the present example, GPU 222 may not have a power weight value that is greater than, say, the brightness of display component 206, despite generating more heat than display component 206 in the present example. This is because the efficient performance of GPU 222 would be comparatively more important to the function of playing the graphics-intensive game compared to the brightness of display component 206, and this task-based priority difference will be reflected in the power weight values for GPU 222 and the brightness of display component 206.

Processor 202, which may function as the CPU of device 200, may be capable of operating at one of multiple selectable discrete operating frequencies. For each of these selectable discrete operating frequencies of processor 202, operations performed by device 200 will have different levels of power usage. For example, an application running on processor 202 may consume 0.1 W/s when the operating frequency of processor 202 is 3.2 GHz, but may consume 0.08 W/s when the operating frequency of processor 202 is 2.6 GHz. Memory 204 may store multiple pre-defined power usage profiles (e.g., in a LUT) for the operations that may be performed by components in device 200, where each pre-defined power usage profile corresponds to a different operating frequency of processor 202 compared to each other pre-defined power usage profile. By determining the operations being performed in device 200 at a given time, comparing these operations to the pre-defined power usage profile associated with the current operating frequency of processor 202, processor 202 may determine individual power weight values for the operations and may also determine how device power usage will change if the operating frequency of processor 202 is reduced or increased. For example, a LUT in memory 204 may relate the multiple operating frequencies of processor 202 to different possible power weight values for an operation of device 200. These power weight values may be used not only for the power management operations described above in connection with claim 9, but may also be used for the thermal management operations described below in connection with claim 12.

Display element 206 of device 200 may include a lighting component that is capable of operating at one of multiple selectable discrete brightness (e.g., illumination) levels. For each of these electable discrete brightness levels, display element 206 will have different levels of power usage. As described above, the brightness level of the lighting component of display element 206 is determined by the duty of a pulse width modulated signal provided to the lighting component by a power supply. The higher this duty cycle is, for example, the greater the brightness level of the lighting component is. Thus, power usage of display element 206 may be modified by modifying the duty cycle of the pulse width modulated signal that powers the lighting component of display element 206. The relationship between the duty cycle of the pulse width modulated signal and the corresponding power usage of display element 206 may be defined in memory 204 (e.g., in a LUT), such that by knowing the duty cycle of the pulse width modulated signal at a given time, the corresponding power usage of the lighting component or, alternatively, the lighting operation performed by the lighting component may be determined for that time. A power weight value may thereby be determined for a lighting operation performed by the lighting component by determining the duty cycle of the pulse width modulated signal, determining the corresponding power usage based on the duty cycle, and determining the power weight value as a percentage of the power usage of display element 206 to the real-time power usage of device 200.

Ideally, the increase in remaining device run-time as a result of the performance of power management functions by power management module 216 will result in a remaining device run-time that is longer than the remaining task run-time, although this may not always be the case. For instances in which increasing the remaining device run-time will not be sufficient to cause the remaining device run-time to exceed the remaining task run-time (e.g., $t_{rem}$ is less than $t_{app}$), processor 202 may notify the user via a popup notification or another desired type of alert, to indicate to the user that the time constrained task being performed within the remaining device run-time of device 202 and, for example, that the user should charge battery 214, if possible.

Figure 10:
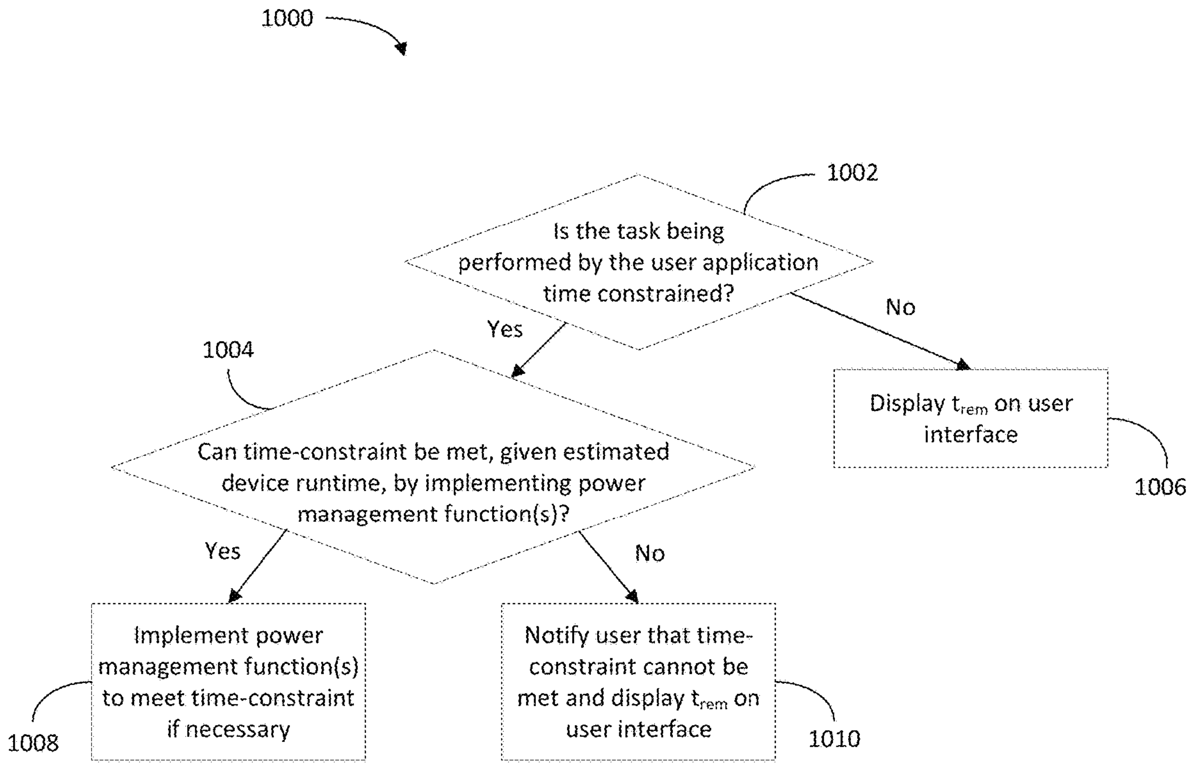
FIG. 10 illustrates an example method for assessing whether power management functions need to be performed in order to meet the time-constraints of an application running on the device that can be used in accordance with various embodiments.

FIG. 10 illustrates a method 1000 for assessing whether the power management functions performed as part of method 900 of FIG. 9 are applicable for use with a given user application. At step 1002, it is determined whether the user application is time constrained. For example, processor 202 may determine whether a user application running on device 200 is performing a task having a remaining time-to-completion that can be determined or estimated by processor 202. If so, the task is considered time constrained and method 1000 proceeds to step 1004. If not, the task is considered to not be time constrained and method 1000 either ends or optionally proceeds to step 1006 at which the remaining device run-time $t_{rem}$ may be calculated and displayed on display component 206 of device 200.

At step 1004, it is determined whether the time-constraint for the task can be met, given the estimated device run-time for the device, if power management functions are implemented. For example, processor 202 may estimate by what amount the estimated device run-time $t_{rem}$ for device 200 would be extended if the power management functions that can be performed by power management module 216 were performed on device 200. If the estimated extended remaining device run-time would meet or exceed the estimated remaining task run-time, then the time-constraint can be met and method 1000 proceeds to step 1008. If the estimated extended remaining device run-time would not exceed the estimated remaining task run-time, the time-constraint cannot be met and method 1000 proceeds to step 1010.

At step 1008, in response to determining that the time-constraint can be met, power management functions such as those described in connection with step 916 of FIG. 9 may be performed in order to extend the remaining device run-time of the device.

At step 1010, in response to determining that the time-constraint cannot be met, the user may be notified that the device run-time is not sufficient to complete the task being undergone by the user application through the user interface and the estimated remaining device run-time may also be displayed. For example, processor 202 may instruct display component 206 to display a popup or alert to the user indicating that the task being performed by the user application will not have time to complete before device 200 experiences a power failure, and the estimated remaining device run-time $t_{rem}$ may also be displayed along with this indication. By alerting the user in this way, the user may be given the opportunity to take corrective action such as reducing power usage themselves or by charging battery 214 of device 200.

Thermal management in portable electronic devices may be desirable to prevent premature failure of components in a device, and to improve reliability of the device. In some thermal management techniques, temperature is monitored in different regions of a device, and when a temperature for a given region exceeds the thermal trip threshold for that region, thermal throttling operations are performed. Thermal throttling refers to disabling or reducing the frequency of operations performed in a device, such as device 200, in order to reduce heat generated by device 200 resulting from these operations. Traditionally these thermal throttling operations are limited to only reducing CPU frequency for the device, which may negatively impact performance of the device, and are reactive, rather than proactive, in responding to excessive temperatures in the device.

Such reactive approaches to thermal management used in conventional thermal management techniques may be disadvantageous with respect to the speed with which a given device or component can be cooled after the device experiences a thermal event (e.g., when the device overheats). For example, such reactive approaches may only begin thermal throttling of a device after the device has exceeded a safe or recommended temperature without initiating any thermal throttling operations or increasing temperature monitoring leading up to this thermal event. During the time period (e.g., thermal delay) between the occurrence of a thermal event in a device and the detection of that event and subsequent thermal throttling of the device, the device may continue to increase in temperature even further beyond the safe or recommended temperature, (e.g., as temperature overshoot). As a result of this thermal delay induced temperature overshoot, device components may be exposed to possible damage from overheating, depending on the severity of the overshoot. In contrast, by proactively monitoring and adjusting power usage in a device to control temperature of the device based on power usage trends, as described below, thermal delay and temperature overshoot may be reduced or eliminated.

Figure 11:
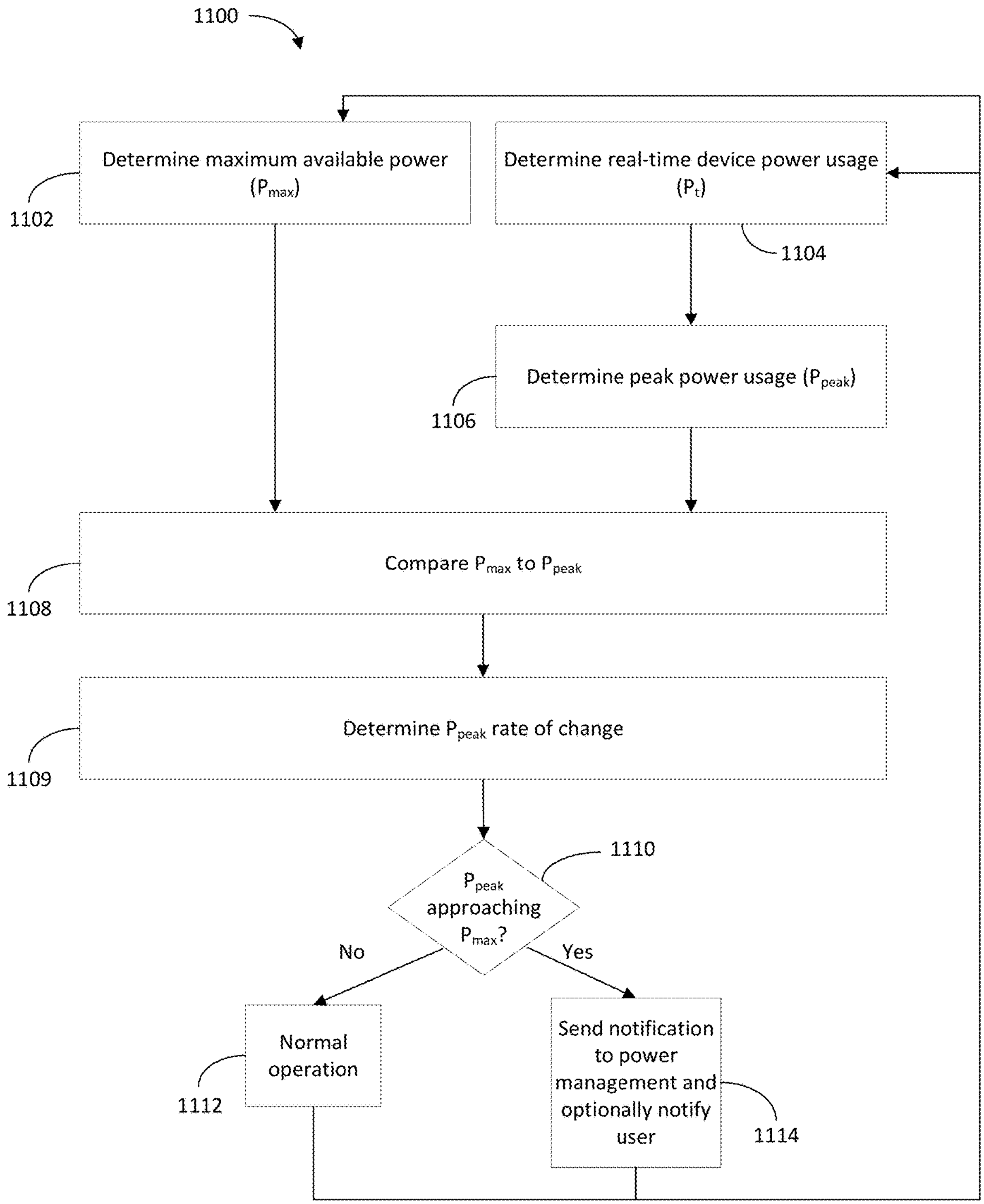
FIG. 11 illustrates an example method for determining whether a peak power usage for a device is trending toward a maximum estimated available power for the device that can be used in accordance with various embodiments.

FIG. 11 illustrates a method 1100 by which a device such as device 200 may implement the present thermal management routine. Specifically, in method 1100 a device such as device 200 may determine if a peak power usage for the device is trending toward maximum estimated available power for the device. At step 1102, estimated maximum available power ($P_{max}$) for a battery in a device is determined. For example, with processor 202, $P_{max}$ may be determined for battery 214 in device 200 according to methods 300 and 400 of FIGS. 3A and 4 described above.

At step 1104, real-time device power usage ($P_t$) is determined for the device. For example, using processor 202, an instantaneous voltage across terminals of battery 214 may be determined (e.g., sampled) from the voltage data produced by sensor circuitry 220 and an instantaneous current output by battery 214 may be determined (e.g., sampled) from the current data produced by sensor circuitry 220. With processor 202, the instantaneous voltage may be multiplied by the instantaneous current in order to produce the real-time device power usage $P_t$. The determined value for $P_t$ may be stored in memory 204 of device 200 along with other previous values for $P_t$ as power usage data for use in calculating power peaks in future iterations of method 1100.

At step 1106, an estimated peak power usage ($P_{peak}$) is determined for the battery. For example, processor 202 may perform peak detection operations on the power usage data (e.g., through monitoring the power usage data and determining local maximum or (peaks) values for the power usage data) stored in memory 204 for a given time period to find the peak power usage value for that time period. The determined value for peak power usage $P_{peak}$ may be stored in memory 204 of device 200 along with other previous values for $P_{peak}$ as peak power data for use in determining whether peak power is increasing or decreasing in future iterations of method 1100. This method for determining $P_{peak}$ is referred to herein as a historical peak power value.

Alternatively, $P_{peak}$ may be determined by assessing the peak possible power demand placed on the device by all applications running on and other operations being performed by the device. For example, a game application running on the device may presently require 0.5 W of power, but may have the potential to require 1 W of power as more complicated graphical elements are rendered. The gaming application's contribution to the peak possible power demand would therefore be the application's potential power requirement (1 W) rather than the application's present power requirement (0.5 W). This method for determining $P_{peak}$ is referred to herein as a potential peak power estimation.

As another example, both the above-mentioned historical peak power value and the potential peak power estimation may be performed. Processor 202 may compare the result of the historical peak power value to the result of the potential peak power estimation, and $P_{peak}$ may be determined to be the greater of the two results.

At step 1108, $P_{max}$ is compared to $P_{peak}$ for the device to determine whether $P_{peak}$ is above a peak power threshold that is defined by $P_{max}$. For example, processor 202 may compare $P_{peak}$ to a peak power threshold that is defined as a predetermined percentage of $P_{max}$ (e.g., a value that is 85% of $P_{max}$). If $P_{peak}$ is greater than the peak power threshold, then $P_{peak}$ can be considered to be within a certain percentage of $P_{max}$ (e.g., within 15% of $P_{max}$). It should be noted that the peak power threshold in this case is not a predetermined value, but is instead defined as a predetermined percentage of estimated maximum available power $P_{max}$, which may vary over time.

At step 1109, the peak power data is analyzed to determine the rate and direction of change of $P_{peak}$. For example, processor 202 may analyze the peak power data in order to determine whether $P_{peak}$ is increasing or decreasing over a particular time period and the rate at which $P_{peak}$ is increasing or decreasing.

At step 1110, it is determined whether $P_{peak}$ is trending toward $P_{max}$ based on both (i) whether $P_{peak}$ is increasing over time as determined at step 1109 and (ii) whether the current $P_{peak}$ value exceeds the peak power threshold as determined at step 1108. If $P_{peak}$ is both increasing and exceeds the peak power threshold, then $P_{peak}$ is trending toward $P_{max}$ and method 1100 proceeds to step 1114, otherwise method 1100 continues normal operation by proceeding to step 1112 and the process is repeated.

At step 1114, a power management module in the device is notified that the peak power usage for the device is trending toward the estimated maximum available power, and the user is optionally notified of this as well. For example, processor 202 may provide a notification or flag to power management module 216 to indicate that $P_{peak}$ is trending toward $P_{max}$ so that power management module may take appropriate action, as described in more detail in connection with FIG. 12 below. Processor 202 may optionally notify the user (e.g., through a popup window or alert shown on a user interface on display component 206) that the peak power usage of device 200 is approaching the estimated maximum available power for device 200 so that the user is given an opportunity to alter their behavior or device usage in order to lower the power usage for device 200 and thereby possibly reduce the risk of $P_{peak}$ exceeding $P_{max}$, which could cause power failure as a result of excessive temperatures in device 200 or of overdrawing power from battery 214.

Upon the completion of step 1114, method 1100 returns to steps 1102 and 1104, which may be performed in parallel, and the process repeats itself. The rate at which method 1100 is performed may correspond to a sampling rate at which currents, and voltages, and temperatures are sampled from the current data, the voltage data, and the temperature data, respectively. This sampling rate may be increased when temperatures in the device are expected to exceed predetermined thermal trip thresholds in order to decrease delay between the crossing of a thermal trip threshold and the onset of the performance thermal throttling in the device, as described in more detail below in connection with FIG. 12.

Figure 12:
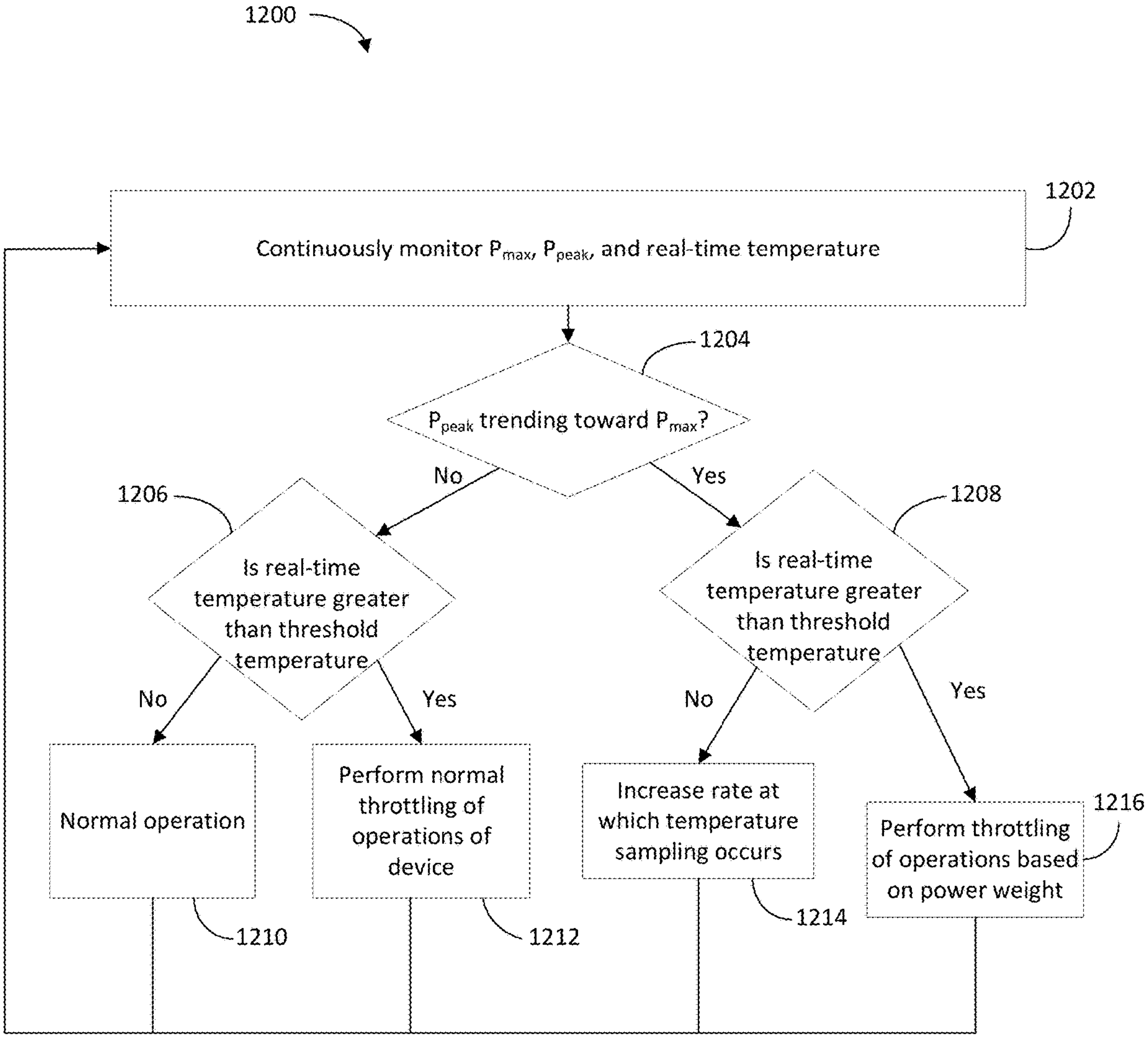
FIG. 12 illustrates an example method for determining if thermal management functions should be performed for a device that can be used in accordance with various embodiments.

FIG. 12 illustrates a method 1200 by which it may be determined which, if any, thermal management functions should be performed for a device such as device 200, and whether the rate or frequency of temperature monitoring in the device should be increased. At step 1202, the estimated maximum available power, the peak power, and the temperature for a device may be continuously monitored, for example, using methods 300, 400, and 1100 described in connection with FIGS. 3A, 4, and 11. At step 1204, it is determined whether $P_{peak}$ is trending toward $P_{max}$, for example, using method 1100 described in connection with FIG. 11. If $P_{peak}$ is trending toward $P_{max}$, method 1200 proceeds to step 1208. If $P_{peak}$ is not trending toward $P_{max}$, method 1200 proceeds to step 1206.

At step 1206, in response to determining that $P_{peak}$ is not trending toward $P_{max}$, it is determined whether one or more current temperatures in the device are greater than respective threshold temperatures. For example, processor 202 may compare a temperature for one region of device 200 taken from the temperature data to a predetermined threshold temperature for that region to determine if that temperature exceeds the predetermined threshold temperature. This process comparison may be repeated for each region of device 200 represented in the temperature data until either one of the temperatures is determined to exceed its corresponding predetermined threshold temperature, or the temperatures for all regions of device 200 have been checked. In response to determining that a temperature for a region of device 200 exceeds its corresponding predetermined threshold temperature, method 1200 proceeds to step 1212. If none of the temperatures for device 200 exceed their corresponding predetermined thresholds, method 1200 proceeds to step 1210 at which normal operation of device 200 continues and the process repeats by returning to step 1202.

At step 1212, in response to determining that a temperature for a region of the device exceeds its corresponding threshold temperature, normal thermal throttling of heat generating components in the device is performed. Normal thermal throttling may involve reducing CPU or GPU frequency in the device without consideration as to how the device is being used or how such thermal throttling might affect tasks being performed on the device. For example, processor 202 may instruct thermal management module 224 to reduce an operating frequency of a CPU in device 200 (which may include processor 202) or to reduce an operating frequency of GPU 222 in order to reduce the amount of power used (by and thereby heat generated by) processor 202 or by GPU 222. Method 1200 then returns to step 1202 to repeat the process.

At step 1208, in response to determining that $P_{peak}$ is trending toward $P_{max}$, it is determined whether one or more temperatures in the device are greater than corresponding threshold temperatures. For example, processor 202 may compare a temperature for one region of device 200 taken from the temperature data to a corresponding predetermined threshold temperature for that region to determine if that temperature exceeds the predetermined threshold temperature. This comparison process may be repeated for each region of device 200 represented in the temperature data until either one of the temperatures is determined to exceed its corresponding predetermined threshold temperature, or the temperatures for all regions of device 200 have been checked. In response to determining that a temperature for a region of device 200 exceeds its corresponding predetermined threshold temperature, method 1200 proceeds to step 1216. If none of the temperatures exceed their corresponding predetermined thresholds, method 1200 proceeds to step 1214.

At step 1214, in response to determining that none of the temperatures in the device exceed their corresponding threshold temperatures, the sampling rate at which temperatures are sampled from the temperature data is increased. For example, processor 202 may increase the rate at which processor 202 samples and processes temperatures (e.g., by increasing the rate at which method 1200 and method 1100 of FIG. 11 are performed) from the temperature data produced by temperature sensors in sensor circuitry 220. By increasing the rate at which temperature monitoring is performed, the delay may be reduced between the occurrence of a temperature exceeding its corresponding threshold and thermal throttling being performed by thermal management module 224 to reduce the detected excessive temperature in device 200. This increase in the rate at which processor 202 samples and processes temperatures is performed in response to determining that $P_{peak}$ is trending toward $P_{max}$ because this condition may be indicative of an increased likelihood that one or more temperatures of device 200 will exceed their corresponding temperature thresholds in the future, even if those temperature thresholds have not presently been exceeded.

At step 1216, in response to determining that a temperature for a region of the device exceeds its corresponding threshold temperature, thermal throttling of heat generating components (e.g., operations) in the device may be performed based on respective power weight values for those heat generating components. For example, processor 202 may instruct thermal management module 224 to reduce the power usage of device 200 by throttling the performance of one or more heat generating components of device 200 (e.g., by reducing an operating frequency of processors or by dimming a display of device 200) or by disabling one or more operations being performed by or applications running on device 200 (e.g., by disabling WiFi, Bluetooth, or global positioning system (GPS) functions of device 200 and components associated with these functions). A volume output by speakers of device 200 may also be reduced in order to reduce power usage. The order in which operations (e.g., applications or functions) of device 200 are throttled or disabled by thermal management module 224 may be determined based on individual power weight values assigned to each of those operations. The power weight value for a given operation may be determined by processor 202 or by thermal management module 224, for example, as a ratio of the measured real-time power usage of the given operation to the estimated maximum available power for battery 214 in device 200. Operations (e.g., applications or functions) having higher measured real-time power usages may be assigned higher power weight values, and therefore have higher priority for thermal throttling operations, while operations having lower measured real-time power usages may be given lower power weight values and therefore have lower priority for thermal throttling operations. The power weight value of a given operation may also be determined based on whether that operation is being actively used in an activity being performed on device 200 (e.g., by a user). For example, a user may be playing a graphics-intensive game on device 200, which relies on the performance of GPU 222. While GPU 222 may be a major source of heat in device 200 in the present example, GPU 222 may not have a power weight value that is greater than, say, that of the brightness of display component 206, despite generating more heat than display component 206 in the present example. This is because the efficient performance of GPU 222 would be comparatively more important to the function of playing the graphics-intensive game compared to the brightness of display component 206, and this task-based priority difference may be reflected in the respective power weight values for GPU 222 and the brightness of display component 206.

Thus, thermal management module 224 will throttle or disable operations of device 200 having higher power weight values first (e.g., with thermal throttling being performed on the operation with the highest power weight value first, on the component, function, or application with the second highest power weight value second, and so on) and will delay the throttling or disablement of operations with comparatively lower power weight values so that the efficiency of the thermal throttling may ideally be maximized while possible negative impacts of the thermal throttling on device performance (e.g., on a task presently being performed by device 200) are minimized. For example, a first operation being performed by device 200 may be assigned a power weight value of twenty, while a second operation being performed by device 200 may be assigned a power weight value of ten. The thermal management circuitry 224 will determine that the power weight value of the first operation is higher than the power weight value of the second operation and will then perform disable or throttle the first operation to reduce the power usage of the first operation before thermal management circuitry 224 disables or throttles the second operation. The amount of operations throttled or disabled by thermal management module 224 may correspond to a difference between the temperature of battery 214 and the thermal trip threshold. For example, more operations of device 200 may be throttled or disabled by thermal management module 224 when the difference between the temperature of battery 214 and the thermal trip threshold is greater. Comparatively, fewer operations of device 200 may be throttled or disabled by thermal management module 224 when the difference between the temperature of battery 214 and the thermal trip threshold is less.

Upon the performance of the thermal throttling by thermal management module 224, method 1200 returns to step 1202 where the process is repeated. The thermal throttling operations continue to be performed as method 1200 repeats until the temperature of battery 214 is determined to have dropped below the predetermined thermal trip threshold.

In an embodiment, a portable electronic device includes a battery, a non-transitory memory, a voltage sensor configured to measure a voltage across the battery, a current sensor configured to measure a current generated by the battery, and a controller. The controller is configured to execute instructions for receiving a first voltage value from the voltage sensor, the first voltage value being measured by the voltage sensor at a first time, receiving a first current value from the current sensor, the first current value being measured by the current sensor at the first time, receiving a second voltage value from the voltage sensor, the second voltage value being measured by the voltage sensor at a second time, and receiving a second current value from the current sensor, the second current value being measured by the current sensor at the second time. The controller is configured to execute instructions for determining that a time difference between the first time and the second time is greater than a predetermined time threshold value, determining that a first difference between the first current value and the second current value is greater than a predetermined current change threshold value, determining a second difference between the first voltage value and the second voltage value, and determining an estimated resistance value for the battery based on the first difference and the second difference. The controller is configured to execute instructions for determining an estimated maximum available power value for the battery based on the estimated resistance value, and controlling real-time power usage of the portable electronic device in response to determining that the real-time power usage of the portable electronic device is greater than a predetermined percentage of the estimated maximum available power.

In an embodiment, a device includes a battery and a controller. The controller is configured to execute instructions for receiving a first voltage value for the battery at a first time, receiving a first current value for the battery, receiving a second voltage value for the battery at a second time, and receiving a second current value for the battery. The controller is configured to execute instructions for determining that a time difference between the first time and the second time exceeds a predetermined time threshold, determining an estimated resistance of the battery based at least on a first difference between the first current value and the second current value and a second difference between the first voltage value and the second voltage value, and controlling real-time power usage of the device based on the estimated resistance of the battery.

In an embodiment, a method includes receiving, with a controller in a device, a first voltage value for a battery in the device, receiving, with the controller, a first current value for the battery. The first voltage value and the first current value are measured at a first time. The method includes receiving, with the controller, a second voltage value for the battery, receiving, with the controller, a second current value for the battery, the second voltage value and the second current value being measured at a second time, and determining, with the controller, that a time difference between the first time and the second time exceeds a predetermined time threshold. The method includes determining, with the controller, an estimated resistance of the battery based at least on a first difference between the first current value and the second current value and a second difference between the first voltage value and the second voltage value, and controlling, with the controller, real-time power usage of the device based on the estimated resistance of the battery.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. A portable electronic device, comprising:

a battery;

a non-transitory memory;

a voltage sensor configured to measure a voltage across the battery;

a current sensor configured to measure a current generated by the battery; and a controller that is configured to execute instructions for:

receiving a first voltage value from the voltage sensor, the first voltage value being measured by the voltage sensor at a first time, receiving a first current value from the current sensor, the first current value being measured by the current sensor at the first time, receiving a second voltage value from the voltage sensor, the second voltage value being measured by the voltage sensor at a second time, receiving a second current value from the current sensor, the second current value being measured by the current sensor at the second time, determining that a time difference between the first time and the second time is greater than a predetermined time threshold value, determining that a first difference between the first current value and the second current value is greater than a predetermined current change threshold value, determining a second difference between the first voltage value and the second voltage value, determining an estimated resistance value for the battery based on the first difference and the second difference, determining an estimated maximum available power value for the battery based on the estimated resistance value, and controlling real-time power usage of the portable electronic device in response to determining that the real-time power usage of the portable electronic device is greater than a predetermined percentage of the estimated maximum available power.

2. The portable electronic device of claim 1, wherein determining the estimated maximum available power for the battery based on the estimated resistance comprises (i) calculating a third difference between the second voltage value and a predetermined minimum operational voltage for the battery (ii) dividing the third difference by the estimated resistance to produce a quotient, and (iii) multiplying the quotient by the second voltage value.

3. The portable electronic device of claim 1, wherein the controller is configured to determine the estimated resistance by:

determining a first value for a first parameter by summing a square of the first difference with a product of a previously determined second value for the first parameter and a forgetting factor, wherein the forgetting factor has a value between 0 and 1;

determining a third value for a second parameter by summing a product of the first difference and the second difference with a product of a previously determined fourth value for the second parameter and the forgetting factor; and determining the estimated resistance by dividing the third value for the second parameter by the first value for the first parameter.

4. The portable electronic device of claim 1, further comprising a temperature sensor configured to measure a temperature of the battery, and wherein the controller is further configured to execute instructions for:

receiving a temperature value from the temperature sensor, the temperature value being measured by the temperature sensor at a third time;

receiving a third voltage value from the voltage sensor, the third voltage value being measured by the voltage sensor at the third time; and selecting a predetermined resistance value from a look-up table in the non-transitory memory, wherein the predetermined resistance value is a second estimated resistance value for the battery and is associated with the temperature value and the third voltage value.

5. A device, comprising:

a battery; and a controller configured to execute instructions for:

receiving a first voltage value for the battery at a first time, receiving a first current value for the battery, receiving a second voltage value for the battery at a second time, receiving a second current value for the battery, determining that a time difference between the first time and the second time exceeds a predetermined time threshold, determining an estimated resistance of the battery based at least on a first difference between the first current value and the second current value and a second difference between the first voltage value and the second voltage value, determining an estimated maximum available power for the battery based on the estimated resistance of the battery, and controlling real-time power usage of the device in response to determining that the real-time power usage of the device is greater than a predetermined percentage of the estimated maximum available power of the battery.

6. The device of claim 5, wherein the controller is configured to determine the estimated resistance by:

determining a first value for a first parameter by summing a square of the first difference with a product of a previously determined second value for the first parameter and a forgetting factor, wherein the forgetting factor has a value between 0 and 1;

determining a third value for a second parameter by summing a product of the first difference and the second difference with a product of a previously determined fourth value for the second parameter and the forgetting factor; and determining the estimated resistance by dividing the third value for the second parameter by the first value for the first parameter.

7. The device of claim 5, wherein the controller is further configured to execute instructions for:

receiving a temperature value for the battery;

receiving a third voltage value for the battery, the temperature value and the third voltage value being measured at a third time; and selecting a predetermined resistance value from a look-up table in a non-transitory memory of the device, wherein the predetermined resistance is a second estimated resistance value for the battery and is associated with the temperature value and the third voltage value.

8. The device of claim 5, wherein the controller is further configured to execute instructions for:

determining the estimated maximum available power for the battery by (i) calculating a third difference between the second voltage value and a predetermined minimum operational voltage for the battery, (ii) dividing the third difference by the estimated resistance to produce a quotient, and (iii) multiplying the quotient by the second voltage value; and determining the real-time power usage of the device by multiplying the second voltage value and the second current value.

9. The device of claim 8, wherein the controller is further configured to execute instructions for:

determining a power status value as a ratio of the real-time power usage of the device to the estimated maximum available power; and causing display of a power gauge indicative of the power status value.

10. The device of claim 5, wherein the controller is configured to control the real-time power usage of the device by disabling an operation of the device, wherein disabling the operation comprises:

identifying the operation to be disabled by determining a power weight value of the operation, wherein the power weight value corresponds to a ratio of a real-time power usage of the operation to the real-time power usage of the device.

11. The device of claim 5, wherein the controller is further configured to execute instructions for:

determining a remaining device run-time for the device based on the real-time power usage of the device;

determining an amount of time required to complete a task being executed by the device;

determining that the remaining device run-time is less than the amount of time required to complete the task; and reducing the real-time power usage of the device.

12. The device of claim 11, wherein determining the remaining device run-time for the device comprises:

determining, at a fourth time, a state of charge for the battery based on the estimated resistance and an open circuit voltage for the battery;

determining energy remaining in the battery using the state of charge for the battery;

determining an average power usage for the device by averaging prior power usage values; and dividing the energy remaining in the battery by the average power usage for the device to generate the remaining device run-time.

13. The device of claim 12, wherein determining the state of charge for the battery comprises:

initiating a sleep mode for the device;

determining the open circuit voltage for the battery;

determining a first state of charge value for the battery based on the estimated resistance and the open circuit voltage for the battery; and determining that a magnitude of a third difference between the first state of charge value and a previously determined second state of charge value stored in a non-transitory memory is greater than a predetermined state of charge threshold.

14. The device of claim 12, wherein determining the state of charge for the battery comprises:

storing a previously determined state of charge value in a non-transitory memory;

initiating a boot-up sequence for the device;

determining a first state of charge value for the battery based on the estimated resistance and the open circuit voltage for the battery; and determining that a magnitude of a third difference between the first state of charge value and a previously determined second state of charge value stored in the non-transitory memory is greater than a predetermined state of charge threshold.

15. A method comprising:

receiving, with a controller in a device, a first voltage value for a battery in the device;

receiving, with the controller, a first current value for the battery, the first voltage value and the first current value being measured at a first time;

receiving, with the controller, a second voltage value for the battery;

receiving, with the controller, a second current value for the battery, the second voltage value and the second current value being measured at a second time;

determining, with the controller, that a time difference between the first time and the second time exceeds a predetermined time threshold;

determining, with the controller, an estimated resistance of the battery based at least on a first difference between the first current value and the second current value and a second difference between the first voltage value and the second voltage value;

determining, with the controller, an estimated maximum available power of the battery based on the estimated resistance of the battery; and controlling, with the controller, real-time power usage of the device in response to determining that the real-time power usage of the device is greater than a predetermined percentage of the estimated maximum available power of the battery.

16. The method of claim 15, wherein determining the estimated resistance of the battery comprises:

determining, with the controller, a first value for a first parameter by summing a square of the first difference with a product of a previously determined second value for the first parameter and a forgetting factor, wherein the forgetting factor has a value between 0 and 1;

determining, with the controller, a third value for a second parameter by summing a product of the first difference and the second difference with a product of a previously determined fourth value for the second parameter and the forgetting factor; and determining, with the controller, the estimated resistance of the battery by dividing the third value of the second parameter value by the first value of the first parameter.

17. The method of claim 15, further comprising:

determining, with the controller, the estimated maximum available power for the battery by (i) calculating a third difference between the second voltage value and a predetermined minimum operational voltage for the battery, (ii) dividing the third difference by the estimated resistance to produce a quotient, and (iii) multiplying the quotient by the second voltage value.

18. The method of claim 17, further comprising:

determining, with the controller, the real-time power usage of the device by multiplying the second voltage value by the second current value;

generating, with the controller, a power status value for the device by dividing the real-time power usage of the device by the estimated maximum available power; and causing, with the controller, display of a power gauge based on the power status value.

19. The method of claim 15, further comprising:

determining, with the controller, a remaining device run-time for the device based on the real-time power usage of the device;

determining, with the controller, an amount of time required to complete a task being executed by the device;

determining, with the controller, that the remaining device run-time is less than the amount of time required to complete the task; and reducing, with the controller, the real-time power usage of the device.

20. The method of claim 19, wherein determining the remaining device run-time for the device comprises:

determining, at a fourth time, a state of charge for the battery based on the estimated resistance and an open circuit voltage for the battery;

determining energy remaining in the battery using the state of charge for the battery;

storing power usage values of the device in a non-transitory memory over a time period preceding the fourth time;

determining an average power usage for the device by averaging the power usage values; and determining the remaining device run-time by dividing the average power usage for the device by the energy remaining in the battery.

* * * * *